(12) United States Patent
Yoshimura et al.

(10) Patent No.: US 10,797,823 B2
(45) Date of Patent: Oct. 6, 2020

(54) TERMINAL APPARATUS, BASE STATION APPARATUS, COMMUNICATION METHOD, AND INTEGRATED CIRCUIT

(71) Applicants: Sharp Kabushiki Kaisha, Sakai, Osaka (JP); FG Innovation Company Limited, Tuen Mun, New Territories (HK)

(72) Inventors: Tomoki Yoshimura, Sakai (JP); Shoichi Suzuki, Sakai (JP); Wataru Ouchi, Sakai (JP); Liqing Liu, Sakai (JP); Kimihiko Imamura, Sakai (JP)

(73) Assignees: SHARP KABUSHIKI KAISHA, Sakai (JP); FG INNOVATION COMPANY LIMITED, New Territories (HK)

( * ) Notice: Subject to any disclaimer, the term of this patent is extended or adjusted under 35 U.S.C. 154(b) by 0 days.

(21) Appl. No.: 16/326,935

(22) PCT Filed: Aug. 29, 2017

(86) PCT No.: PCT/JP2017/030965
§ 371 (c)(1),
(2) Date: Feb. 21, 2019

(87) PCT Pub. No.: WO2018/043494
PCT Pub. Date: Mar. 8, 2018

(65) Prior Publication Data
US 2019/0229847 A1    Jul. 25, 2019

(30) Foreign Application Priority Data
Sep. 2, 2016  (JP) .................................. 2016-171589

(51) Int. Cl.
*H04L 27/26*    (2006.01)
*H04L 1/00*    (2006.01)
(Continued)

(52) U.S. Cl.
CPC .......... *H04L 1/0047* (2013.01); *H03M 13/09* (2013.01); *H04L 1/0038* (2013.01);
(Continued)

(58) Field of Classification Search
None
See application file for complete search history.

(56) References Cited

U.S. PATENT DOCUMENTS

2019/0229861 A1*  7/2019  Yoshimura ............ H04L 1/0043

OTHER PUBLICATIONS

U.S. Appl. No. 16/317,587, Yoshimura et al, Transmisson Appartus, Reception Apparatus, Communication Method, and Integrated Circuit, effective filed Jul. 18, 2017, amended claims 17 & 19 filed Dec. 6, 2019. (Year: 2019).*

(Continued)

*Primary Examiner* — Phuongchau Ba Nguyen
(74) *Attorney, Agent, or Firm* — Keating & Bennett, LLP

(57) ABSTRACT

A terminal apparatus includes: a receiver configured to detect a DCI format in a search space; a coding unit configured to divide a transport block into one or multiple code blocks, based at least on the DCI format and code the one or multiple code blocks to generate coded bits; and a transmitter configured to transmit the coded bits on a PUSCH. Multiplexed bits are given based at least on concatenation of the coded bits generated by coding the one or multiple code blocks. The coding unit maps the multiplexed bits to a matrix in a first-axis prioritized manner and reads out the multiplexed bits mapped to the matrix in the first-axis prioritized manner or a second-axis prioritized manner. Whether to prioritize the first axis or the second axis in a case of reading out the multiplexed bits mapped to the matrix, is based at least on whether or not the search space is CSS.

4 Claims, 15 Drawing Sheets

(51) Int. Cl.
*H04W 72/04* (2009.01)
*H03M 13/09* (2006.01)

(52) U.S. Cl.
CPC ............ *H04L 1/0071* (2013.01); *H04L 27/26* (2013.01); *H04L 27/2649* (2013.01); *H04W 72/04* (2013.01); *H04W 72/0406* (2013.01)

(56) References Cited

OTHER PUBLICATIONS

"3rd Generation Partnership Project; Technical Specification Group Radio Access Network; Evolved Universal Terrestrial Radio Access (E-UTRA); Study on latency reduction techniques for LTE (Release 13)", 3GPP TR 36.881 V0.5.2, Feb. 2016, pp. 1-92.

Ericsson, "New Work Item on shortened TTI and processing time for LTE", 3GPP TSG RAN Meeting #72, RP-161299, Jun. 13-16, 2016, 8 pages.

ZTE, "Processing time reduction and related procedures", 3GPP TSG RAN WG1 Meeting #84bis, R1-162408, Apr. 11-15, 2016, pp. 1-4.

LG Electronics et al., "WF on fallback operations for shortened processing time in 1ms TTI", 3GPP TSG RAN1 #86, R1-168231, Aug. 22-26, 2016, 2 pages.

\* cited by examiner

PUSCH timing k and corresponding maximum TBS threshold

| TBS | Timing k |
|---|---|
| 0<TBS<=Max TBS1 | K1 |
| Max TBS1<TBS<Max TBS2 | K2 |
| Max TBS2<=TBS | 4 |

PUSCH timing k and corresponding maximum TBS threshold

| TBS | Timing k |
|---|---|
| 0<TBS<=Max TBS3 | K3 |
| Max TBS3<TBS | 4 |

HARQ-ACK timing j and
corresponding maximum TBS threshold

| TBS | Timing j |
|---|---|
| 0<TBS<=Max TBS1 | j1 |
| Max TBS1<TBS<Max TBS2 | j2 |
| Max TBS2<=TBS | 4 |

FIG. 13A

HARQ-ACK timing j and
corresponding maximum TBS threshold

| TBS | Timing j |
|---|---|
| 0<TBS<=Max TBS3 | j3 |
| Max TBS3<TBS | 4 |

FIG. 13B

PUSCH timing k and corresponding maximum TA threshold

| TA | Timing k |
|---|---|
| 0<TA<=Max TA1 | Ka |
| Max TA1<TA<Max TA2 | Kb |
| Max TA2<=TA | 4 |

FIG. 14A

PUSCH timing k and corresponding maximum TA threshold

| TA | Timing k |
|---|---|
| 0<TA<=Max TA3 | Kc |
| Max TA3<TA | 4 |

FIG. 14B

HARQ-ACK timing j and corresponding maximum TA threshold

| TA | Timing j |
|---|---|
| 0<TA<=Max TA1 | ja |
| Max TA1<TA<Max TA2 | jb |
| Max TA2<=TA | 4 |

FIG. 15A

HARQ-ACK timing j and corresponding maximum TA threshold

| TA | Timing j |
|---|---|
| 0<TA<=Max TA3 | jc |
| Max TA3<TA | 4 |

FIG. 15B

TERMINAL APPARATUS, BASE STATION APPARATUS, COMMUNICATION METHOD, AND INTEGRATED CIRCUIT

TECHNICAL FIELD

The present invention relates to a terminal apparatus, a base station apparatus, a communication method, and an integrated circuit.

This application claims priority based on Japanese Patent Application No. 2016-171589 filed on Sep. 2, 2016, the contents of which are incorporated herein by reference.

BACKGROUND ART

In the 3rd Generation Partnership Project (3GPP), a radio access method and a radio network for cellular mobile communications (hereinafter, referred to as "Long Term Evolution (LTE)", or "Evolved Universal Terrestrial Radio Access (EUTRA)") have been studied (NPL 1). In LTE, a base station apparatus is also referred to as an evolved NodeB (eNodeB), and a terminal apparatus is also referred to as a User Equipment (UE). LTE is a cellular communication system in which multiple areas are deployed in a cellular structure, with each of the multiple areas being covered by a base station apparatus. In such a cellular communication system, a single base station apparatus may manage multiple cells.

In 3GPP, latency reduction enhancements have been studied. For example, as a solution to latency reduction, Semi-Persistent Scheduling (SPS), UL Grant reception, Configured SPS activation and deactivation have been studied (NPL 1). In addition, study about reducing processing time with legacy (1 ms) Transmission Time Interval (TTI) has begun. (NPL 2)

CITATION LIST

Non Patent Literature

NPL 1: "3GPP TR 36.881 V0.5.2 (2016-02) Evolved Universal Terrestrial Radio Access (E-UTRA); Study on latency reduction techniques for LTE (Release 13)", R2-161963, Ericsson.

NPL 2: "Work Item on shortened TTI and processing time for LTE", RP-161299, Ericsson, 3GPP TSG RAN Meeting #72, Busan, Korea, Jun. 13-16, 2016

SUMMARY OF INVENTION

Technical Problem

However, for the radio communication system as described above, a concrete method for a procedure for reducing processing time in a TTI has not been sufficiently studied.

An aspect of the present invention provides a terminal apparatus, a base station apparatus, a communication method, and an integrated circuit which enable efficient communication.

Solution to Problem (1) To accomplish the object described above, aspects of the present invention are contrived to provide the following measures. Specifically, a first aspect of the present invention is a terminal apparatus including: a receiver configured to detect a DCI format in a search space; a coding unit configured to divide a transport block into one or multiple code blocks, based at least on the DCI format and code the one or multiple code blocks to generate coded bits; and a transmitter configured to transmit the coded bits on a PUSCH, wherein multiplexed bits are given based at least on concatenation of the coded bits generated by coding the one or multiple code blocks, the coding unit maps the multiplexed bits to a matrix in a first-axis prioritized manner and reads out the multiplexed bits mapped to the matrix in the first-axis prioritized manner or a second-axis prioritized manner, and whether to prioritize the first axis or the second axis in a case of reading out the multiplexed bits mapped to the matrix, is based at least on whether or not the search space is CSS.

(2) A second aspect of the present invention is a base station apparatus including: a transmitter configured to transmit a DCI format in a search space; a receiver configured to receive a PUSCH transmitted based on the DCI format; and a decoding unit configured to decode coded bits of one or multiple code blocks given by dividing a transport block included in the PUSCH, wherein multiplexed bits are given based at least on concatenation of the coded bits generated by coding the one or multiple code blocks, the decoding unit maps the multiplexed bits to a matrix in a first-axis prioritized manner and reads out the multiplexed bits mapped to the matrix in the first-axis prioritized manner or a second-axis prioritized manner, and whether to prioritize the first axis or the second axis in a case of reading out the multiplexed bits mapped to the matrix, is based at least on whether or not the search space is CSS.

(3) A third aspect of the present invention is a communication method used by a terminal apparatus, the communication method including the steps of: detecting a DCI format in a search space; dividing a transport block into one or multiple code blocks, based at least on the DCI format; coding the one or multiple code blocks to generate coded bits; and transmitting the coded bits on a PUSCH, wherein multiplexed bits are given based at least on concatenation of the coded bits generated by coding the one or multiple code blocks, the multiplexed bits are mapped to a matrix in a first-axis prioritized manner, and the multiplexed bits mapped to the matrix are read out in the first-axis prioritized manner or a second-axis prioritized manner, and whether to prioritize the first axis or the second axis in a case of reading out the multiplexed bits mapped to the matrix, is based at least on whether or not the search space is CSS.

(4) A fourth aspect of the present invention is a communication method used by a base station apparatus, the communication method including the steps of: transmitting a DCI format in a search space; receiving a PUSCH transmitted based on the DCI format; and decoding coded bits of one or multiple code blocks given by dividing a transport block included in the PUSCH, wherein multiplexed bits are given based at least on concatenation of the coded bits generated by coding the one or multiple code blocks, the multiplexed bits are mapped to a matrix in a first-axis prioritized manner, and the multiplexed bits mapped to the matrix are read out in the first-axis prioritized manner or a second-axis prioritized manner, and whether to prioritize the first axis or the second axis in a case of reading out the multiplexed bits mapped to the matrix, is based at least on whether or not the search space is CSS.

(5) A fifth aspect of the present invention is an integrated circuit mounted on a terminal apparatus, the integrated circuit including: a receiver circuit configured to detect a DCI format in a search space; a coding circuit configured to divide a transport block into one or multiple code blocks, based at least on the DCI format and code the one or multiple code blocks to generate coded bits; and a transmitter circuit configured to transmit the coded bits on a PUSCH, wherein multiplexed bits are given based at least on concatenation of the coded bits generated by coding the one or multiple code blocks, the multiplexed bits are mapped to a matrix in a first-axis prioritized manner, and the multiplexed bits mapped to the matrix are read out in the first-axis prioritized manner or a second-axis prioritized manner, and whether to prioritize the first axis or the second axis in a case of reading out the multiplexed bits mapped to the matrix, is based at least on whether or not the search space is CSS.

(6) A sixth aspect of the present invention is an integrated circuit mounted on a base station apparatus, the integrated circuit including: a transmitter circuit configured to transmit a DCI format in a search space; a receiver circuit configured to receive a PUSCH transmitted based on the DCI format; and a decoding circuit configured to decode coded bits of one or multiple code blocks given by dividing a transport block included in the PUSCH, wherein multiplexed bits are given based at least on concatenation of the coded bits generated by coding the one or multiple code blocks, the multiplexed bits are mapped to a matrix in a first-axis prioritized manner, and the multiplexed bits mapped to the matrix are read out in the first-axis prioritized manner or a second-axis prioritized manner, and whether to prioritize the first axis or the second axis in a case of reading out the multiplexed bits mapped to the matrix, is based at least on whether or not the search space is CSS.

Advantageous Effects of Invention

According to an aspect of the present invention, a base station apparatus and a terminal apparatus can efficiently communicate with each other.

BRIEF DESCRIPTION OF DRAWINGS

FIG. 13A is a diagram illustrating an example of a maximum TBS threshold and a corresponding HARQ-ACK transmission timing (value of j) according to the present embodiment.

FIG. 13B is a diagram illustrating another example of the maximum TBS threshold and the corresponding HARQ-ACK transmission timing (value of j) according to the present embodiment.

FIG. 14A is a diagram illustrating an example of a PUSCH transmission timing (value of k) and a corresponding prescribed maximum TA threshold according to the present embodiment.

FIG. 14B is a diagram illustrating another example of the PUSCH transmission timing (value of k) and the corresponding prescribed maximum TA threshold according to the present embodiment.

FIG. 15A is a diagram illustrating an example of an HARQ-ACK transmission timing (value of j) and a corresponding prescribed maximum TA threshold according to the present embodiment.

FIG. 15B is a diagram illustrating another example of the HARQ-ACK transmission timing (value of j) and the corresponding prescribed maximum TA threshold according to the present embodiment.

DESCRIPTION OF EMBODIMENTS

Embodiments of the present invention will be described below.

Figure 1:
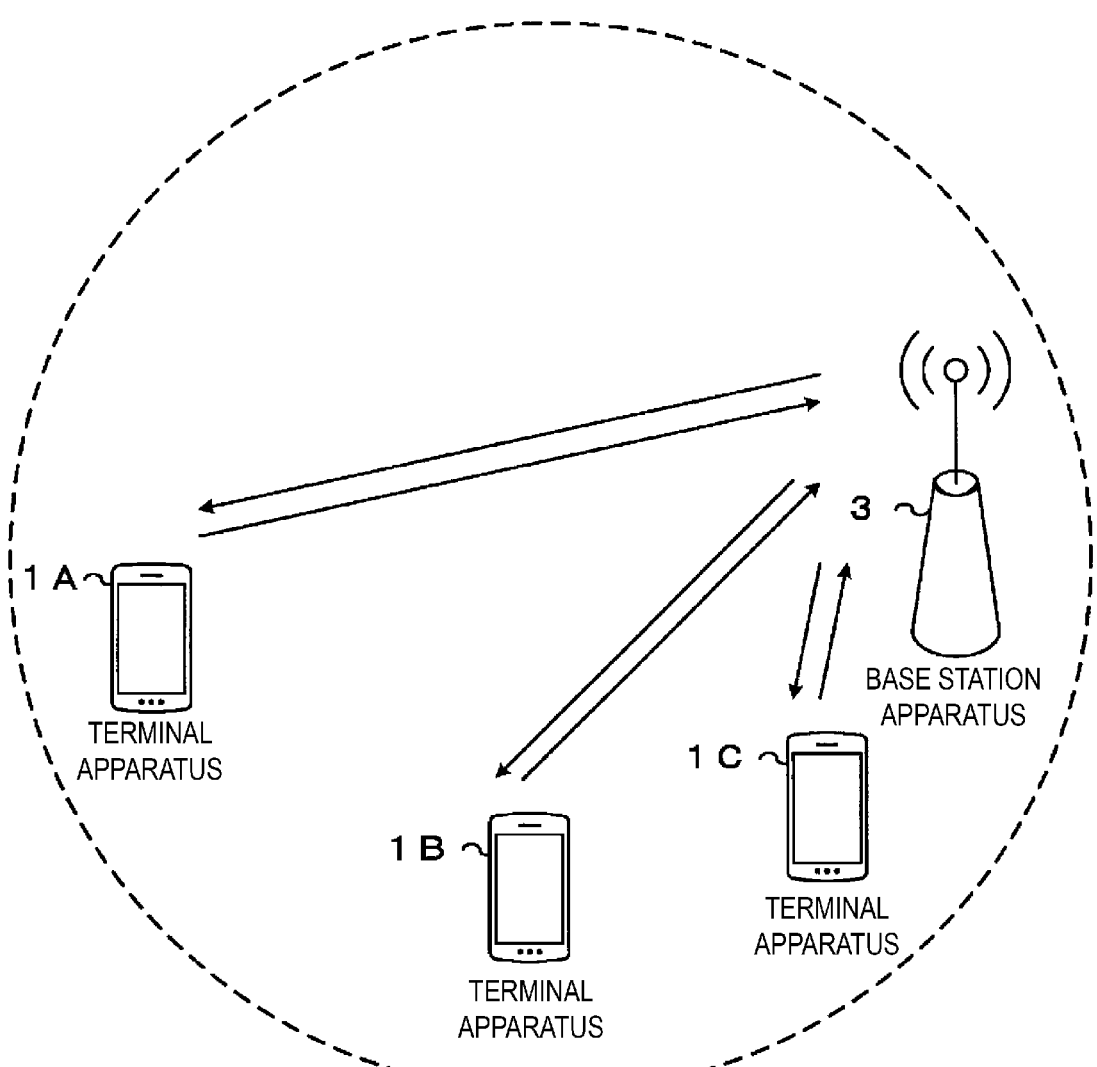
FIG. 1 is a diagram illustrating a concept of a radio communication system according to the present embodiment.

FIG. 1 is a conceptual diagram of a radio communication system according to the present embodiment. In FIG. 1, a radio communication system includes terminal apparatuses 1A to 1C and a base station apparatus 3. Hereinafter, each of the terminal apparatuses 1A to 1C is also referred to as a terminal apparatus 1.

Figure 2:
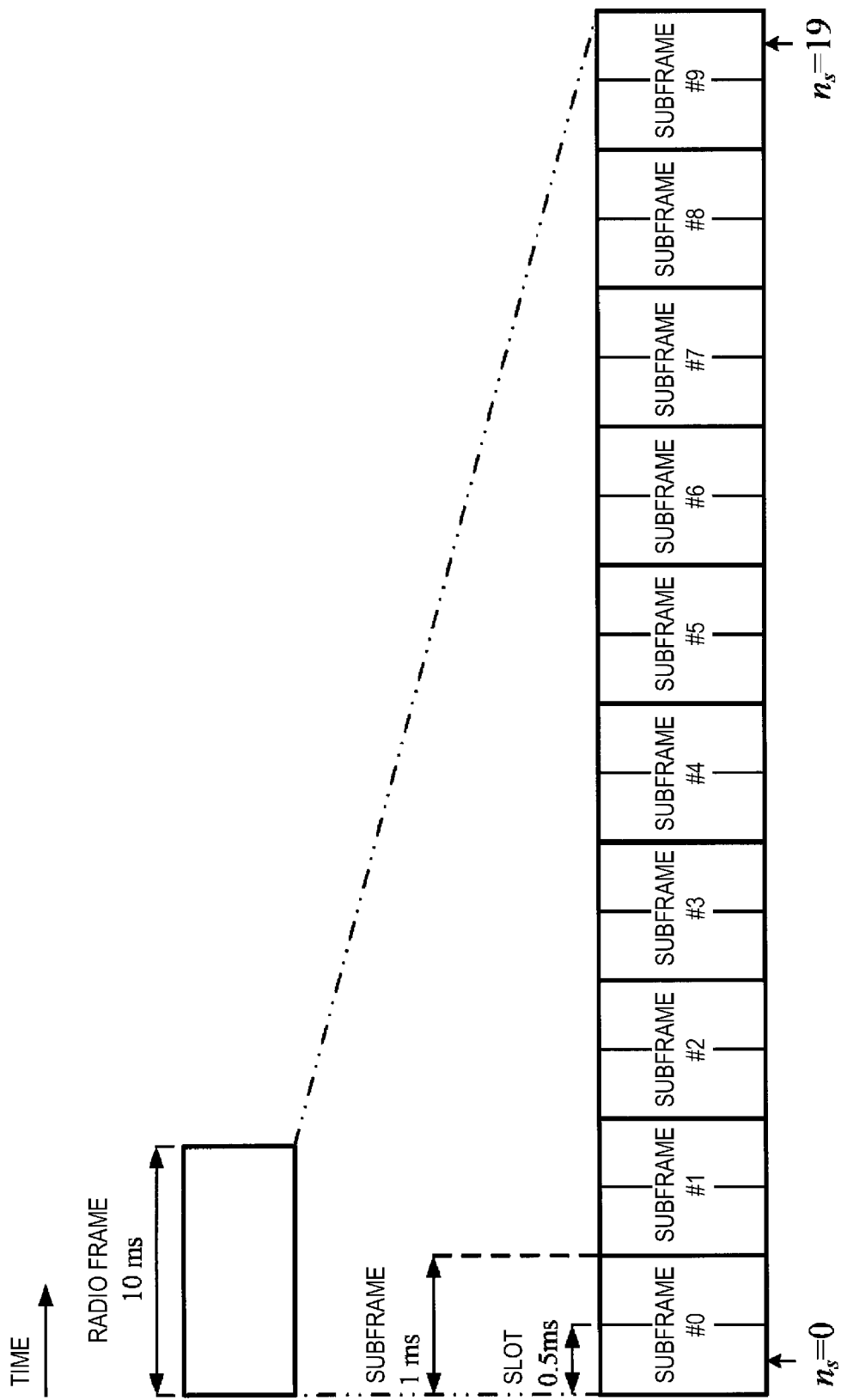
FIG. 2 is a diagram illustrating a schematic configuration of a radio frame according to the present embodiment.

FIG. 2 is a diagram illustrating a schematic configuration of a radio frame according to the present embodiment. In FIG. 2, the horizontal axis is a time axis.

The size of various fields in the time domain is expressed by the number of time units $T_s=1/(15000*2048)$ sec. The length of each of the radio frames is $T_f=307200*T_s=10$ ms. Each of the radio frames includes ten contiguous subframes in the time domain. The length of each of the subframes is $T_{subframe}=30720*T_s=1$ ms. Each of subframes i includes two contiguous slots in the time domain. The two contiguous slots in the time domain are a slot having a slot number $n_s$ of 2i in the radio frame and a slot having a slot number $n_s$ of 2i+1 in the radio frame. The length of each of the slots is $T_{slot}=153600*n_s=0.5$ ms. Each of the radio frames includes ten contiguous subframes in the time domain. Each of the radio frames includes 20 contiguous slots ($n_s=0, 1, \ldots, 19$) in the time domain.

Figure 3:
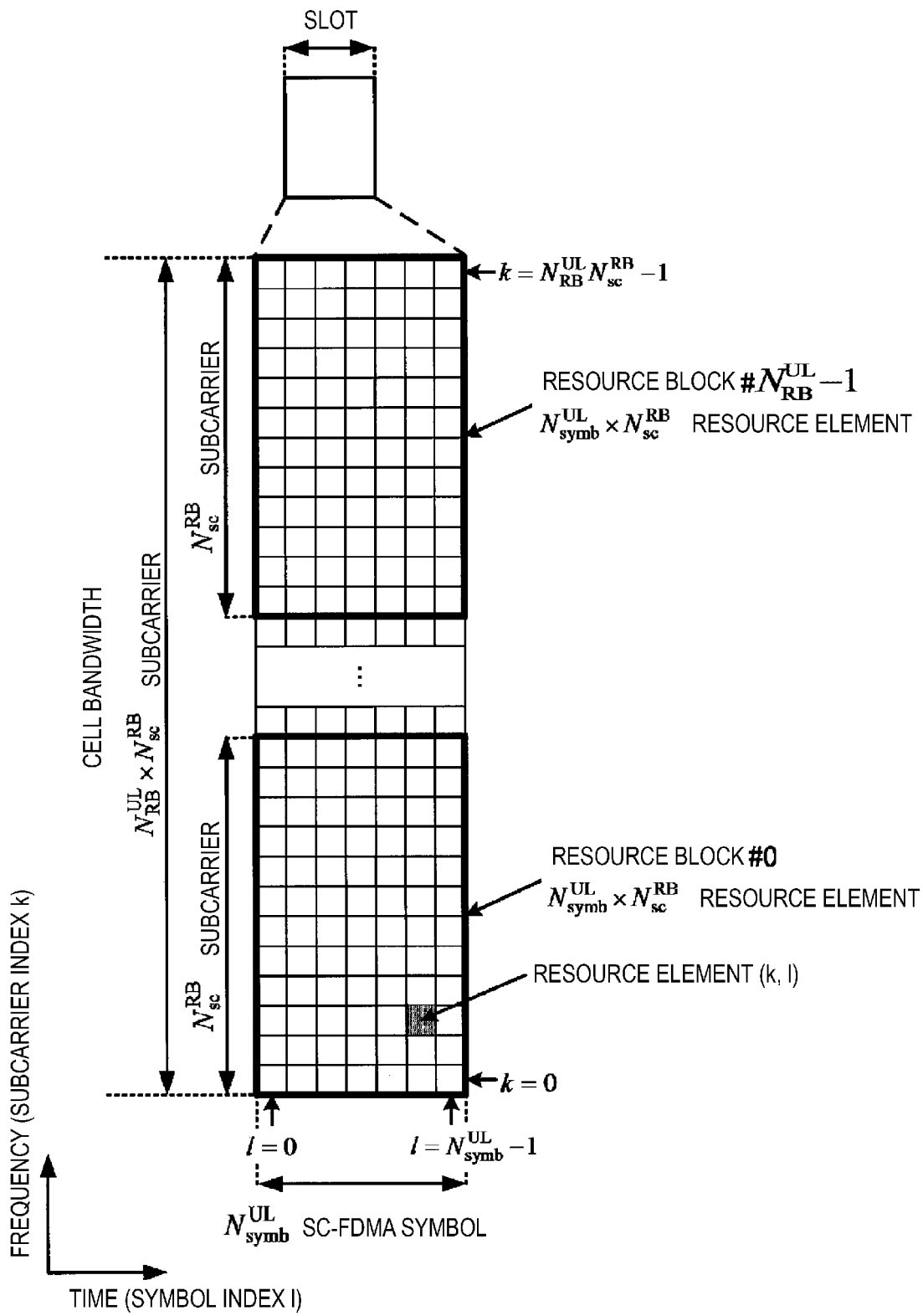
FIG. 3 is a diagram illustrating a schematic configuration of an uplink slot according to the present embodiment.

A configuration of a slot according to the present embodiment will be described below. FIG. 3 is a diagram illustrating a schematic configuration of an uplink slot according to the present embodiment. FIG. 3 illustrates a configuration of an uplink slot in one cell. In FIG. 3, the horizontal axis is a time axis, and the vertical axis is a frequency axis. In FIG. 3, 1 denotes a Single Carrier-Frequency Division Multiple Access (SC-FDMA) symbol number/index, and k denotes a subcarrier number/index.

The physical signal or the physical channel transmitted in each of the slots is expressed by a resource grid. In uplink, the resource grid is defined by multiple subcarriers and multiple SC-FDMA symbols. Each element in the resource grid is referred to as a resource element. The resource element is expressed by a subcarrier number/index k and a SC-FDMA symbol number/index 1.

The resource grid is defined for each antenna port. In the present embodiment, description is given for one antenna port. The present embodiment may be applied to each of multiple antenna ports.

The uplink slot includes multiple SC-FDMA symbols 1 ($l=0, 1, \ldots, N^{UL}_{symb}$) in the time domain. $N^{UL}_{symb}$ indicates the number of SC-FDMA symbols included in one uplink slot. For a normal Cyclic Prefix (CP), $N^{UL}_{symb}$ is 7. For an extended Cyclic Prefix (CP), $N^{UL}_{symb}$ is 6. In other words, for a normal CP, one subframe is configured of 14 SC-FDMA symbols. For an extended CP, one subframe is configured of 12 SC-FDMA symbols.

The uplink slot includes multiple subcarriers k ($k=0, 1, \ldots, N^{UL}_{RB}*N^{RB}_{SC}$) in the frequency domain. $N^{UL}_{RB}$ is an uplink bandwidth configuration for the serving cell expressed by a multiple of $N^{RB}_{SC}$. $N^{RB}_{SC}$ is the (physical) resource block size in the frequency domain expressed by the number of subcarriers. In the present embodiment, the subcarrier interval Δf is 15 kHz, and $N^{RB}_{SC}$ is 12 subcarriers. In other words, in the present embodiment, $N^{RB}_{SC}$ is 180 kHz.

A resource block is used to express mapping of a physical channel to resource elements. For the resource block, a virtual resource block and a physical resource block are defined. A physical channel is first mapped to a virtual resource block. Thereafter, the virtual resource block is mapped to a physical resource block. One physical resource block is defined by $N^{UL}_{symb}$ consecutive SC-FDMA symbols in the time domain and $N^{RB}_{SC}$ consecutive subcarriers in the frequency domain. Hence, one physical resource block is constituted by ($N^{UL}_{symb}*N^{RB}_{SC}$) resource elements. One physical resource block corresponds to one slot in the time domain. The physical resource blocks are numbered ($0, 1, \ldots, N^{UL}_{RB}-1$) in ascending order of frequencies in the frequency domain.

A downlink slot according to the present embodiment includes multiple OFDM symbols. Since the configuration of the downlink slot according to the present embodiment is the same except that a resource grid is defined by multiple subcarriers and multiple OFDM symbols, a description of the configuration of the downlink slot will be omitted.

Here, a Transmission Time Interval (TTI) may be defined for downlink transmission and/or uplink transmission. In other words, downlink transmission and/or uplink transmission may be performed in one transmission time interval (length of one transmission time interval).

For example, in downlink, a TTI is constituted of 14 OFDM symbols (one subframe). A transmission time interval constituted of less than 14 OFDM symbols is also referred to as a short Transmission Interval (sTTI).

In uplink, a TTI is constituted of 14 SC-FDMA symbols (one subframe). A transmission time interval constituted of less than 14 OFDM symbols is also referred to as a sTTI.

Physical channels and physical signals according to the present embodiment will be described.

In FIG. 1, in uplink radio communication from the terminal apparatus 1 to the base station apparatus 3, the following uplink physical channels are used. Here, the uplink physical channels are used to transmit information output from higher layers.

Physical Uplink Control Channel (PUCCH)
Physical Uplink Shared Channel (PUSCH)
Physical Random Access Channel (PRACH)

The PUCCH is used to transmit Uplink Control Information (UCI). Here, the uplink control information may include Channel State Information (CSI) for downlink. The uplink control information may include a Scheduling Request (SR) used to request a UL-SCH resource. The uplink control information may include Hybrid Automatic Repeat request ACKnowledgement (HARQ-ACK).

Here, HARQ-ACK may indicate HARQ-ACK for downlink data (Transport block, Medium Access Control Protocol Data Unit (MAC PDU), Downlink-Shared Channel (DL-SCH), or Physical Downlink Shared Channel (PDSCH)). In other words, HARQ-ACK may indicate acknowledgement (ACK, positive-acknowledgement) or negative-acknowledgement (NACK) for downlink data. The CSI may include a channel quality indicator (CQI), a precoding matrix indicator (PMI), and/or rank indication (RI). The HARQ-ACK may be referred to as an HARQ-ACK response or an ACK/NACK response.

The PUSCH is used to transmit uplink data (Uplink-Shared Channel (UL-SCH)). The PUSCH is used to transmit random access message 3. Furthermore, the PUSCH may be used to transmit HARQ-ACK and/or CSI along with uplink data not including random access message 3. Furthermore, the PUSCH may be used to transmit CSI only or HARQ-ACK and CSI only. In other words, the PUSCH may be used to transmit the uplink control information only.

Here, the base station apparatus 3 and the terminal apparatus 1 may exchange (transmit and/or receive) signals with each other in their respective higher layers. For example, the base station apparatus 3 and the terminal apparatus 1 may transmit and/or receive RRC signaling (also referred to as an RRC message or RRC information) in Radio Resource Control (RRC) layers. The base station apparatus 3 and the terminal apparatus 1 may exchange (transmit and/or receive) a Medium Access Control (MAC) control element in MAC layers. Here, the RRC signaling and/or the MAC control element is also referred to as higher layer signaling.

Here, in the present embodiment, a "higher layer parameter", a "higher layer message", "higher layer signaling", "higher layer information", and a "higher layer information element" may refer to the same.

The PUSCH may be used to transmit the RRC signaling and the MAC control element. Here, the RRC signaling transmitted from the base station apparatus 3 may be signaling common to multiple terminal apparatuses 1 in a cell. The RRC signaling transmitted from the base station apparatus 3 may be signaling dedicated to a certain terminal apparatus 1 (also referred to as dedicated signaling). In other words, user-equipment-specific information (information specific to a user equipment) may be transmitted through signaling dedicated to the certain terminal apparatus 1.

The PRACH is used to transmit a random access preamble. For example, a main object of the PRACH (or a random access procedure) is to allow the terminal apparatus 1 to synchronize with the base station apparatus 3 in terms of the time domain. The PRACH (or a random access procedure) may also be used for an initial connection establishment procedure, a handover procedure, a connection re-establishment procedure, uplink transmission synchronization (timing adjustment), and transmission of a scheduling request (PUSCH resource request or UL-SCH resource request).

In FIG. 1, the following uplink physical signal is used in the uplink radio communication. Here, the uplink physical signal is not used to transmit information output from the higher layers but is used by the physical layer.

Uplink Reference Signal (UL RS)

According to the present embodiment, the following two types of uplink reference signals are used.

Demodulation Reference Signal (DMRS)

Sounding Reference Signal (SRS)

The DMRS is associated with transmission of the PUSCH or the PUCCH. The DMRS is time-multiplexed with the PUSCH or the PUCCH. The base station apparatus 3 uses the DMRS in order to perform channel compensation of the PUSCH or the PUCCH. Transmission of both the PUSCH and the DMRS is hereinafter referred to simply as transmission of the PUSCH. Transmission of both the PUCCH and the DMRS is hereinafter referred to simply as transmission of the PUCCH.

The SRS is not associated with the transmission of the PUSCH or the PUCCH. The base station apparatus 3 may use SRS for measurement of a channel state. The SRS is transmitted using the last SC-FDMA symbol in an uplink subframe or a SC-FDMA symbol in the UpPTS.

In FIG. 1, the following downlink physical channels are used for downlink radio communication from the base station apparatus 3 to the terminal apparatus 1. Here, the downlink physical channels are used to transmit the information output from higher layers.

Physical Broadcast Channel (PBCH)
Physical Control Format Indicator Channel (PCFICH)
Physical Hybrid automatic repeat request Indicator Channel (PHICH)
Physical Downlink Control Channel (PDCCH)
Enhanced Physical Downlink Control Channel (EPDCCH)
Physical Downlink Shared Channel (PDSCH)
Physical Multicast Channel (PMCH)

The PBCH is used for broadcasting a Master Information Block (MIB, Broadcast Channel (BCH)) that is shared by the terminal apparatuses 1.

The PCFICH is used for transmission of information indicating a region (OFDM symbols) to be used for transmission of the PDCCH.

The PHICH is used for transmission of an HARQ indicator (HARQ feedback or response information) indicating an ACKnowledgement (ACK) or a Negative ACKnowledgement (NACK) for the uplink data (Uplink Shared Channel (UL-SCH)) received by the base station apparatus 3.

The PDCCH and the EPDCCH are used to transmit Downlink Control Information (DCI). The downlink control information is also referred to as DCI format. The downlink control information includes a downlink grant and an uplink grant. The downlink grant is also referred to as downlink assignment or downlink allocation.

Here, multiple DCI formats may be defined for the downlink control information transmitted using the PDCCH and/or the EPDCCH. In other words, a field for the downlink control information may be defined in a DCI format and mapped to information bits.

Here, the DCI format for the downlink is also referred to as a downlink DCI, a downlink grant, and/or downlink assignment. The DCI format for the uplink is also referred to as an uplink DCI, an Uplink grant, and/or Uplink assignment. The DCI grant may include a downlink grant (DL grant) and an uplink grant (UL grant).

The DCIs included in the PDCCH and the EPDCCH may include a DL grant for the PDSCH.

In other words, one downlink grant may be used for scheduling of one PDSCH in one serving cell. The downlink grant may be used for the scheduling of the PDSCH in the same subframe as the subframe in which the downlink grant is transmitted.

Here, the downlink grant may include information associated with downlink allocation for one or multiple terminal apparatuses 1. Specifically, the downlink grant may include at least one of frequency allocation information (Resource allocation), Modulation and Coding (MCS), the number of transmit antenna ports, Scramble Identity (SCID), the number of layers, a New Data Indicator, a Redundancy Version (RV), the number of transport blocks, precoder information, and information of a transmission scheme, for one or multiple terminal apparatuses 1.

One uplink grant is used for scheduling of one PUSCH in one serving cell. The uplink grant is used for scheduling of the PUSCH in the fourth or later subframe from the subframe in which the uplink grant is transmitted.

The uplink grant transmitted on the PDCCH includes DCI format 0. A PUSCH transmission scheme corresponding to DCI format 0 is a single antenna port. The terminal apparatus 1 uses a single antenna port transmission scheme for PUSCH transmission corresponding to DCI format 0. The PUSCH to which the single antenna port transmission scheme is applied is used for transmission of one codeword (single transport block).

The uplink grant transmitted on the PDCCH includes DCI format 4. A PUSCH transmission scheme corresponding to DCI format 4 is closed-loop spatial multiplexing. The terminal apparatus 1 uses a closed-loop spatial multiplexing transmission scheme for PUSCH transmission corresponding to DCI format 4. The PUSCH to which the closed-loop spatial multiplexing transmission scheme is applied is used for transmission of up to two codewords (up to two transport blocks).

The terminal apparatus 1 may monitor a set of PDCCH candidates and a set of EPDCCH candidates. The PDCCH may include an EPDDCH below.

Here, the PDCCH candidates may be candidates which the PDCCH may be mapped to and/or transmitted by the base station apparatus 3. Furthermore "monitor" may imply that the terminal apparatus 1 attempts to decode each PDCCH in the set of PDCCH candidates in accordance with each of all the monitored DCI formats.

Here, the set of PDCCH candidates monitored by the terminal apparatus 1 is also referred to as a search space. The search space may include a Common Search Space (CSS). For example, the common search space may be defined as a space common to multiple terminal apparatuses 1. The common search space may include a Control Channel Element (CCE) of an index defined in advance in a specification or the like.

The search space may include a UE-specific Search Space (USS). For example, the index of the CCE constituting the UE-specific search space may be given based at least on a C-RNTI assigned to the terminal apparatus 1. The terminal apparatus 1 may monitor the PDCCHs in the common search space and/or the UE-specific search space to detect a PDCCH destined for the terminal apparatus 1 itself.

Figure 4:
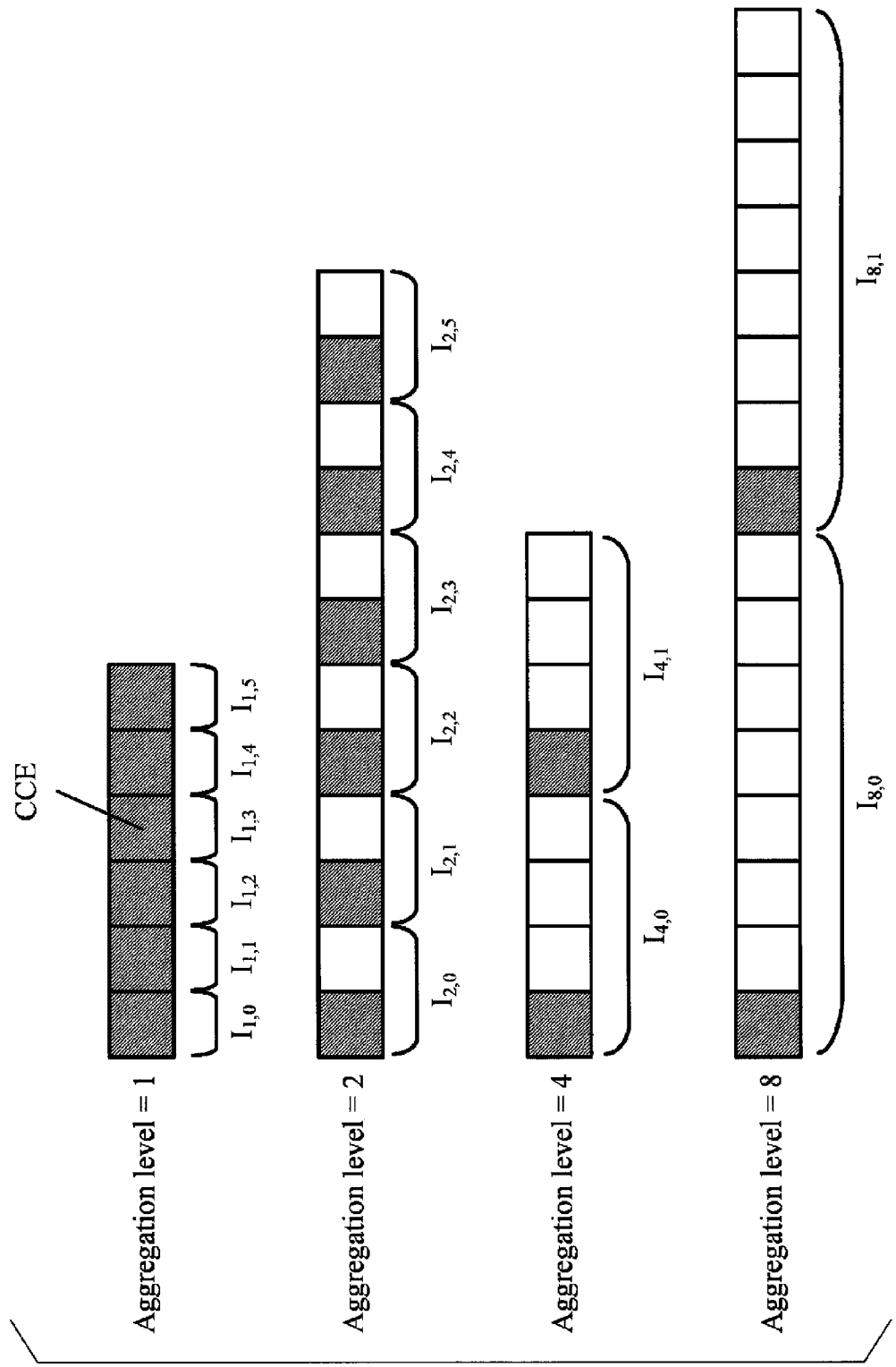
FIG. 4 is a diagram illustrating examples of CCE indices in a search space according to the present embodiment.

FIG. 4 is a diagram illustrating examples of CCE indices in the search space. FIG. 4 is an example of a case in which Aggregation levels are 1, 2, 4, and 8. Each of square blocks illustrated in FIG. 4 represents a single CCE. An aggregation level here corresponds to the number of CCEs constituting each of PDCCHs including a DCI format (the number of aggregated CCEs). Specifically, for example, in a case of Aggregation level 4, each PDCCH including a DCI format is constituted by four CCEs. Here, $I_{AL, INDEX}$ denotes a CCE index of the INDEX-th PDCCH in Aggregation level AL. For example, the CCE index of the PDCCH may be the index of the CCE with hatch lines (the first CCE among the CCEs constituting the PDCCH). The CCE index of the PDCCH may relate to part of or all indices of the CCEs constituting the PDCCH.

Here, in the present embodiment, "a PDCCH is detected", "a DCI format is detected", and "a PDCCH including a DCI format is detected" may refer to the same.

An RNTI assigned to the terminal apparatus 1 by the base station apparatus 3 may be used for the transmission of the downlink control information (transmission on the PDCCH). Specifically, Cyclic Redundancy check (CRC) parity bits may be attached to the DCI format (or downlink control information), and after the attaching, the CRC parity bits may be scrambled with the RNTI. Here, the CRC parity bits attached to the DCI format may be obtained from a payload of the DCI format.

Here, in the present embodiment, "CRC parity bits", "CRC bits", and "CRC" may refer to the same. Moreover, a "PDCCH on which a DCI format to which CRC parity bits are attached is transmitted", a "PDCCH including CRC parity bits and a DCI format", a "PDCCH including CRC parity bits", and a "PDCCH with a DCI format" may refer to the same. A "PDCCH including X" and a "PDCCH with X" may refer to the same. The terminal apparatus 1 may monitor DCI formats. The terminal apparatus 1 may monitor DCIs. The terminal apparatus 1 may monitor PDCCHs.

The terminal apparatus 1 attempts to decode the DCI format to which the CRC parity bits scrambled with the RNTI are attached, and detects, as a DCI format destined for the terminal apparatus 1 itself, the DCI format for which the CRC has been successful (also referred to as blind decoding). In other words, the terminal apparatus 1 may detect the PDCCH with the CRC scrambled with the RNTI. The terminal apparatus 1 may detect the PDCCH including the DCI format to which the CRC parity bits scrambled with the RNTI are attached.

Here, the RNTI may include a Cell-Radio Network Temporary Identifier (C-RNTI). For example, the C-RNTI may be an identifier unique to the terminal apparatus 1 and used for the identification in RRC connection and scheduling. The C-RNTI may be used for dynamically scheduled unicast transmission.

The RNTI may include a Semi-Persistent Scheduling C-RNTI (SPS C-RNTI). For example, the SPS C-RNTI is an identifier unique to the terminal apparatus 1 and used for semi-persistent scheduling. The SPS C-RNTI may be used for semi-persistently scheduled unicast transmission. Here, the semi-persistently scheduled transmission may include meaning of periodically scheduled transmission.

The RNTI may include a Random Access RNTI (RA-RNTI). For example, the RA-RNTI may be an identifier used for transmission of a random access response message. In other words, the RA-RNTI may be used for the transmission of the random access response message in a random access procedure. For example, the terminal apparatus 1 may monitor the PDCCH with the CRC scrambled with the RA-RNTI in a case of the transmission of a random access preamble. The terminal apparatus 1 may receive a random access response on the PDSCH upon detection of the PDCCH with the CRC scrambled with the RA-RNTI.

RNTI may include a Temporary C-RNTI. For example, the Temporary C-RNTI may be an identifier unique to the preamble transmitted by the terminal apparatus 1 and used during a contention based random access procedure. The Temporary C-RNTI may be used for dynamically scheduled transmission.

The RNTI may include a Paging RNTI (P-RNTI). For example, the P-RNTI may be an identifier used for paging and notification of system information change. For example, the P-RNTI may be used for paging and transmission of a system information message. For example, the terminal apparatus 1 may receive paging on the PDSCH upon detection of the PDCCH with the CRC scrambled with the P-RNTI.

The RNTI may include a System Information RNTI (SI-RNTI). For example, the SI-RNTI may be an identifier used for broadcast of the system information. For example, the SI-RNTI may be used for transmission of the system information message. For example, the terminal apparatus 1 may receive the system information message on the PDSCH upon detection of the PDCCH with the CRC scrambled with the SI-RNTI.

Here, the PDCCH with the CRC scrambled with the C-RNTI may be transmitted in the USS or CSS. The PDCCH with the CRC scrambled with the SPS C-RNTI may be transmitted in the USS or CSS. The PDCCH with the CRC scrambled with the RA-RNTI may be transmitted only in the CSS. The PDCCH with the CRC scrambled with the P-RNTI may be transmitted only in the CSS. The PDCCH with the CRC scrambled with the SI-RNTI may be transmitted only in the CSS. The PDCCH with the CRC scrambled with the Temporary C-RNTI may be transmitted only in the CSS.

The PDSCH is used to transmit downlink data (Downlink Shared Channel (DL-SCH)). The PDSCH may be used to transmit a random access response grant. Here, the random access response grant is used for scheduling of the PUSCH in the random access procedure. The random access response grant is indicated to the physical layer by a higher layer (e.g., the MAC layer).

The PDSCH is used to transmit a system information message. Here, the system information message may be cell-specific information. The system information may be included in RRC signaling. The PDSCH may be used to transmit the RRC signaling and a MAC control element.

The PMCH is used to transmit multicast data (Multicast Channel (MCH)).

In FIG. 1, the following downlink physical signals are used for downlink radio communication. Here, the downlink physical signals are not used to transmit the information output from higher layers but are used by the physical layer.

Synchronization signal (SS)

Downlink Reference Signal (DL RS)

The synchronization signal is used for the terminal apparatus 1 to take synchronization in the frequency domain and the time domain in the downlink. In the TDD scheme, the synchronization signal is mapped to subframes 0, 1, 5, and 6 in a radio frame. In the FDD scheme, the synchronization signal is mapped to subframes 0 and 5 in a radio frame.

The downlink reference signal is used for the terminal apparatus 1 to perform channel compensation on a downlink physical channel. Here, the downlink reference signal is used in order for the terminal apparatus 1 to calculate the downlink channel state information.

According to the present embodiment, the following seven types of downlink reference signals are used.

Cell-specific Reference Signal (CRS)
UE-specific Reference Signal (URS) relating to the PDSCH
Demodulation Reference Signal (DMRS) relating to the EPDCCH
Non-Zero Power Chanel State Information-Reference Signal (NZP CSI-RS)
Zero Power Chanel State Information-Reference Signal (ZP CSI-RS)
Multimedia Broadcast and Multicast Service over Single Frequency Network Reference signal (MBSFN RS)
Positioning Reference Signal (PRS)

Here, the downlink physical channel and the downlink physical signal are also collectively referred to as a downlink signal. The uplink physical channel and the uplink physical signal are also collectively referred to as an uplink signal. The downlink physical channel and the uplink physical channel are collectively referred to also as a physical channel. The downlink physical signal and the uplink physical signal are collectively referred to also as a physical signal.

The BCH, the MCH, the UL-SCH, and the DL-SCH are transport channels. A channel used in the Medium Access Control (MAC) layer is referred to as a transport channel. A unit of the transport channel used in the MAC layer is also referred to as a transport block (TB) or a MAC Protocol Data Unit (PDU). A Hybrid Automatic Repeat reQuest (HARQ) is controlled for each transport block in the MAC layer. The transport block is a unit of data that the MAC layer delivers to the physical layer. In the physical layer, the transport block is mapped to a codeword, and coding processing is performed for each codeword.

Figure 5:
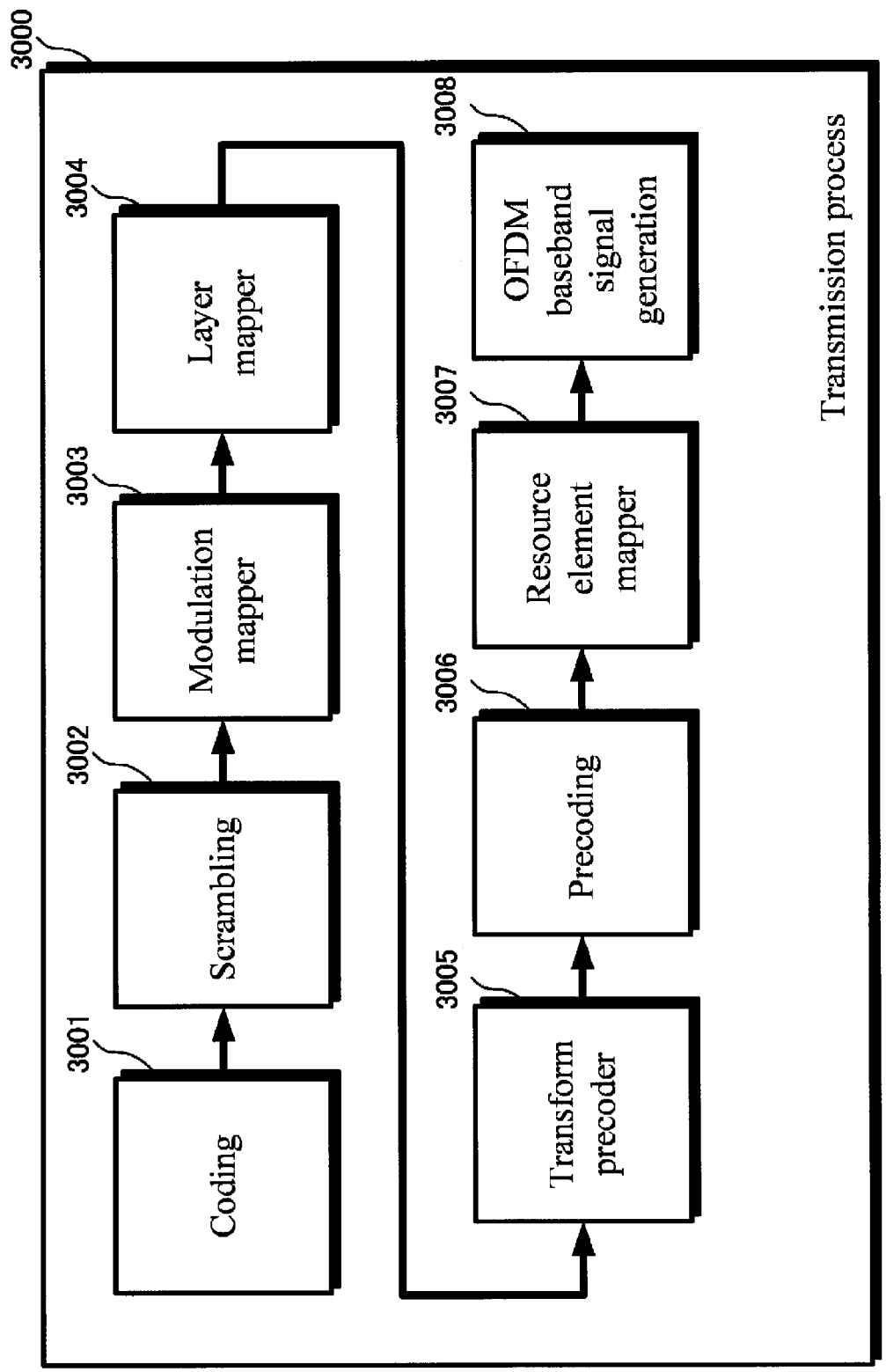
FIG. 5 is a diagram illustrating an example of a configuration of a Transmission process 3000 according to the present embodiment.

FIG. 5 is a diagram illustrating an example of a configuration of a Transmission process 3000 in the physical layer. The Transmission process 3000 has a configuration of including at least one of a coding (coding unit) 3001, a Scrambling (scrambling unit) 3002, a Modulation mapper (modulation mapper unit) 3003, a Layer mapper (layer mapper unit) 3004, a Transform precoder (transform precoder unit) 3005, a Precoder (precoder unit) 3006, a Resource element mapper (resource element mapper unit) 3007, and an OFDM baseband signal generation (OFDM baseband signal generation unit) 3008. In a case that the Transmission process 3000 does not include at least one of the units (the coding 3001, the Scrambling 3002, the Modulation mapper 3003, the Layer mapper 3004, the Transform precoder 3005, the Precoder 3006, the Resource element mapper 3007, and the OFDM baseband signal generation 3008), the unit(s) not included in the Transmission process 3000 may be considered to be short-circuited. The unit being short-circuited may refer to an input to the unit and an output from the unit being identical.

For example, the coding 3001 may have a function of converting a transport block (or a data block, transport data, transmission data, a transmission code, a transmission block, payload, information, an information block, or the like) sent (or notified, transferred, transmitted, delivered, or the like) from a higher layer through error correction coding, into coded bits. For example, the error correction coding includes a Turbo code, a convolutional code (or a Tail biting convolutional code, or the like), a block code, a Reed Muller (RM) code, and a repetition code. The coding 3001 has a function of sending the coded bits to the Scrambling 3002. Details of operations of the coding 3001 will be described later.

The Scrambling 3002 has a function of converting the coded bits to scramble bits through scrambling. The scramble bits may be obtained by performing addition modulo 2 on the coded bits and a scramble sequence. In other words, scrambling may be performing addition modulo 2 on the coded bits and the scramble sequence. The scramble sequence may be a sequence generated using a pseudo-random function, based on a specific sequence (e.g., Cell specific-Radio Network Temporary Identifier (C-RNTI)). The specific sequence may be an RNTI configured for a Reduced timing operation other than a C-RNTI.

The Modulation mapper 3003 has a function of converting the scramble bits to modulated bits through modulation mapping. The modulated bits are obtained by performing modulation, such as Quadrature Phase Shift Keying (QPSK), 16 Quadrature Amplitude Modulation (QAM), 64 QAM, or 256 QAM, on the scramble bits. Here, the modulated bits are also referred to as modulated symbols.

The Layer mapper 3004 may have a function of mapping the modulated bits to layers. A layer here is an index relating to multiplicity of physical layer signals in a spatial domain. Specifically, for example, in a case that the number of layers is one, this means that no spatial multiplexing is performed. In a case that the number of layers is two, this means that two kinds of physical layer signals are spatial-multiplexed.

In uplink, the Transmission process 3000 includes the Transform precoder 3005. The Transform precoder 3005 has a function of performing transform precoding on the modulated bits mapped to the layers to thereby generate transmission bits. The modulated bits and transmission bits may be complex-value symbols. For example, the transform precoding includes processing based on DFT spread (DFT spreading) and the like. Here, the transmission bits are also referred to as transmission symbols. The modulated bits are also referred to as modulated symbols.

The Precoder 3006 has a function of multiplying the transmission bits by a precoder to thereby generate transmission bits for each transmit antenna port. The transmit antenna port is a logical antenna port. A single transmit antenna port may be configured by multiple physical antennas. A logical antenna port may be identified using a precoder.

The Resource element mapper 3007 has a function of performing processing for mapping the transmission bits for each transmit antenna port to resource elements. A method of mapping to resource elements in the Resource element mapper 3007 will be described later in detail.

The OFDM baseband signal generation 3008 may have a function of converting the transmission bits mapped to the resource elements into a baseband signal. The processing for converting the transmission bits into the baseband signal may include, for example, Inverse Fast Fourier Transform (IFFT), Windowing, Filter processing, or the like. In the Transmission process 3000, higher layer signaling and a control channel may be transmitted from one of the terminal apparatus 1 and the base station apparatus 3. In the Transmission process 3000, higher layer signaling and a control channel may be received by the other one of the terminal apparatus 1 and the base station apparatus 3. In the Transmission process 3000, function information of the terminal apparatus 1 including the Transmission process 3000 may be transmitted to the base station apparatus 3 by using higher layer signaling or a control channel. Here, the function information of the terminal apparatus 1 may be information indicating a function of the terminal apparatus 1. Information indicating the function of the terminal apparatus 1 may be, for example, information indicating an error correction coding scheme that the terminal apparatus 1 supports. The information indicating the function of the terminal apparatus 1 may be associated with a Processing time necessary for processing for a transport block transmitted from the base station apparatus 1. The information indicating the function of the terminal apparatus 1 may be the smallest value acceptable to the terminal apparatus 1 as a period from transmission of a transport block from the terminal apparatus 1 to a time point at which reception of receive acknowledgement for the transport block is expected. The information indicating the function of the terminal apparatus 1 may be the smallest value acceptable to the terminal apparatus 1 as a period from reception of a transport block at the terminal apparatus 1 to a time point at which transmission of receive acknowledgement for the transport block is expected.

Details of operations of the coding 3001 will be described in detail.

Figure 6:
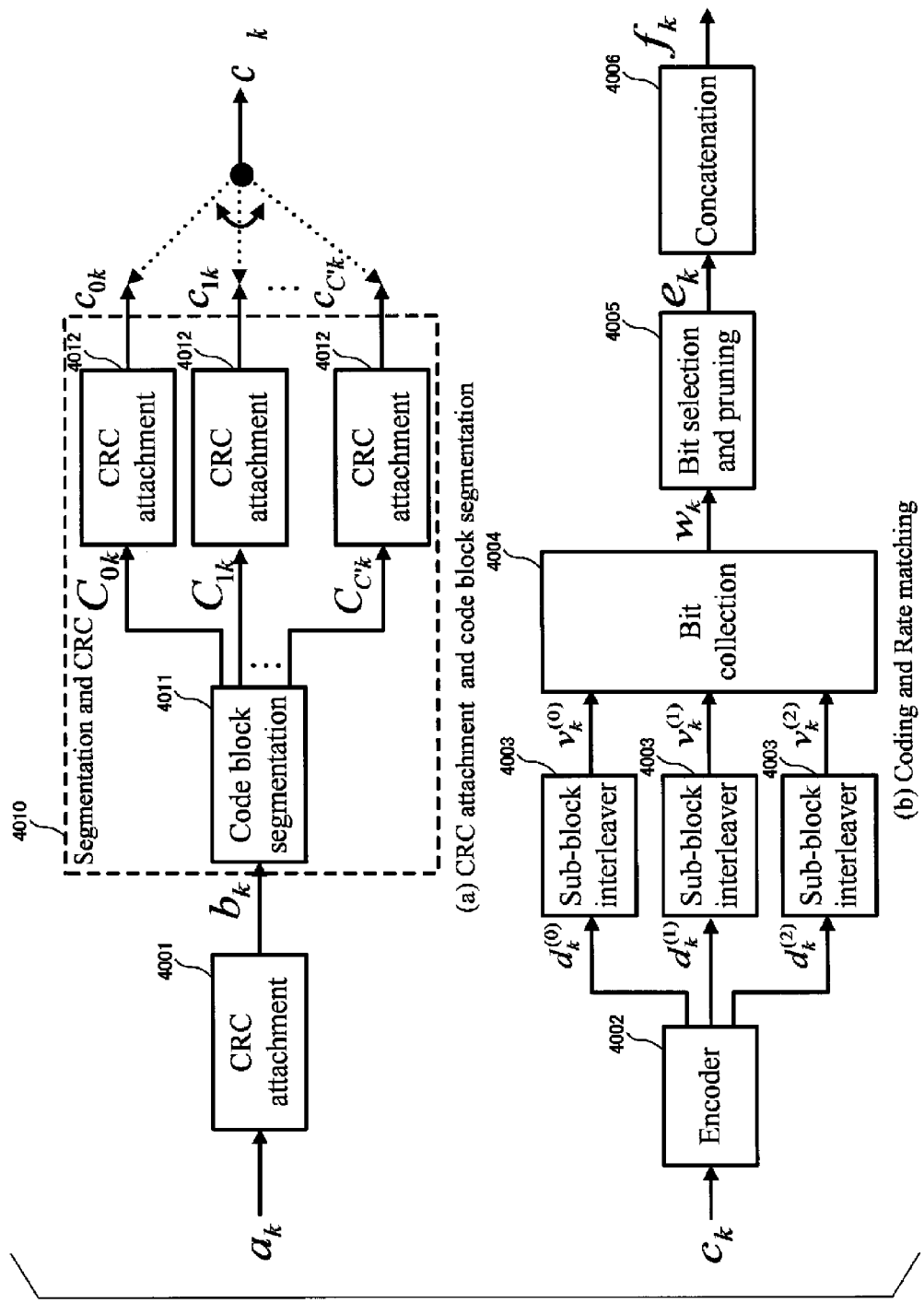
FIG. 6 is a diagram illustrating a configuration example of a coding 3001 according to the present embodiment.

FIG. 6 is a diagram illustrating a configuration example of the coding 3001 according to the present embodiment. The coding 3001 is configured by including at least one of a CRC attachment unit 4001, a Segmentation and CRC unit 4010, an Encoder unit 4002, a Sub-block interleaver unit 4003, a Bit collection unit 4004, a Bit selection and pruning unit 4005, and a Concatenation unit 4006. Here, the Segmentation and CRC unit 4010 is configured by including at least one of a code block segmentation unit 4011 and one or multiple CRC attachment units 4012. In a case that the coding 3001 does not include at least one of the units (the CRC attachment unit 4001, the Segmentation and CRC unit 4010, the Encoder unit 4002, the Sub-block interleaver unit 4003, the Bit collection unit 4004, the Bit selection and pruning unit 4005, the Concatenation unit 4006, the code block segmentation unit 4011, and the one or multiple CRC attachments), the unit(s) not included in the coding may be considered as being short-circuited. The unit being short-circuited may refer to an input to the unit and an output from the unit being identical.

For example, a transport block (also referred to as $a_k$) may be input to the CRC attachment unit 4001. The CRC attachment unit 4001 may generate CRC bits as error detection redundancy bits, based on the input transport block. The generated CRC bits are attached to the transport block. The transport block to which the CRC bits are attached (also referred to as $b_k$) is output from the CRC attachment unit 4001. In the CRC attachment unit 4001, the number of CRC bits to be attached to the transport block may be given based on a prescribed condition 401.

For example, $b_k$ may be input to the code block segmentation unit 4011. The code block segmentation unit 4012 may divide $b_k$ into one or multiple Code blocks. For example, in a case that $b_k$ satisfies $b_k > Z$, $b_k$ may be divided into multiple code blocks. Here, Z denotes a maximum code block length.

The maximum code block length Z may be given based on the prescribed condition 401.

The maximum code block length Z of the transport block may be given based on the prescribed condition 401.

Here, the maximum code block length Z may be rephrased as a code block length.

The code block length of multiple code blocks generated from a single transport block may be the same for all the code blocks. Alternatively, the code block lengths of the multiple code blocks constituting a single transport block may be different among all the code blocks. Here, the code block length(s) of the multiple code blocks constituting a single transport block may also be referred to as a code block length(s).

The code block length may be a unit of error correction coding. In other words, error correction coding may be performed on each of the code blocks. In the following, as an aspect of the present invention, processing will be described based on an example of performing error correction coding on each of the code blocks. However, another aspect of the present invention may be based on processing of performing error correction coding on multiple code blocks.

The code block segmentation unit 4011 may output C' (C' is an integer equal to or greater than 1) code block(s) ($C_{0k}$ to $C_{C'k}$).

The code block(s) may be input to the CRC attachment unit(s) 4012. Each CRC attachment unit 4012 may generate CRC bits, based on the code block. The CRC attachment unit 4012 may attach the generated CRC bits to the code block. The CRC attachment units 4012 may output a sequence to which the CRC bits are attached to the code block(s) ($c_{0k}$ to $c_{C'k}$). Here, in a case that code block segmentation is not performed (case of C'=1), the CRC attachment unit 4012 may not necessarily attach CRC to the code block.

In the CRC attachment units 4012, the number of CRC bits to be attached to the code block(s) may be given based on the prescribed condition 401.

Each of the code block(s) output from the CRC attachment units 4012 is input to the Encoder unit 4002. In a case of C'>1, an input to the Encoder unit 4002 is a code block selected sequentially. In the following, a single one of the code blocks ($C_{0k}$ to $C_{C'k}$) input to the Encoder unit 4002 is also referred to as $C_k$.

The Encoder unit 4002 has a function of performing error correction coding on the input code block $C_k$. As error correction coding, a turbo code is used by the Encoder unit 4002. The Encoder unit 4002 performs error correction coding on the code block $C_k$ and outputs Coded bits. The output coded bits are $d_k^{(0)}$, $d_k^{(1)}$, and $d_k^{(2)}$. Here, $d_k^{(0)}$ may be a systematic bit. $d_k^{(1)}$ and $d_k^{(2)}$ are parity bits. The coded bits are also referred to as a sub-block.

The coded bits output from the coding 4002 are input to the Sub-block interleaver units 4003.

Figure 7:
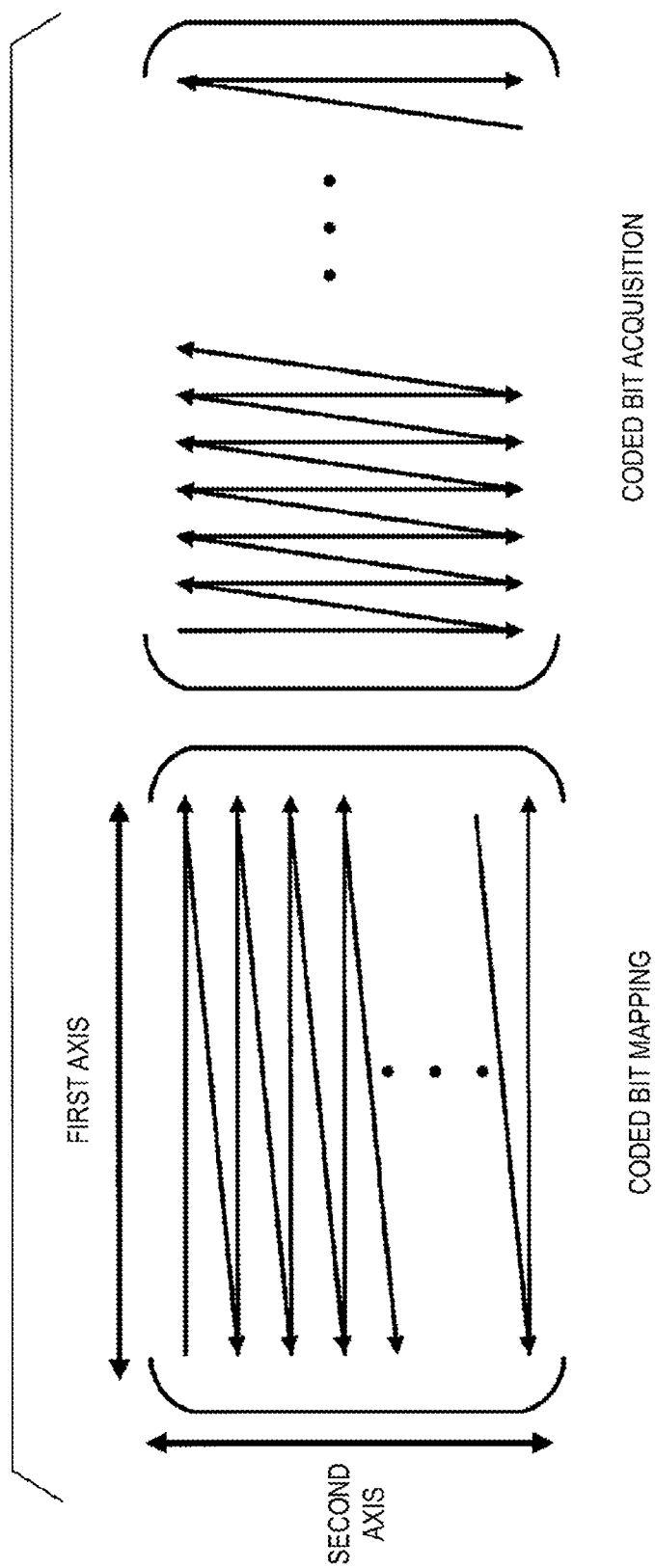
FIGS. 7A and 7B are diagrams illustrating an example of coded bit arrangement change according to the present embodiment.

The coded bits are input to the Sub-block interleaver units 4003. The Sub-block interleaver units 4003 have a function of changing arrangement of coded bits. FIGS. 7A and 7B are diagrams illustrating an example of coded bit arrangement change by the Sub-block interleaver unit 4003 according to the present embodiment. Each Sub-block interleaver unit 4003 may map the coded bits to two-dimensional block B. Here, block B may be one-dimensional, three-dimensional or higher. For example, block B may have a first axis and a second axis. Here, the first axis is also referred to as a horizontal axis or a column. The second axis is also referred to as a vertical axis or a row. In block B, a point specified by a certain one point on the first axis and a certain one point on the second axis is also referred to as an element. Here, a single element may be a single coded bit (or correspond to a single coded bit). The Sub-block interleaver unit 4003 may map (write) the coded bits in first-axis prioritized manner. Here, the mapping method illustrated in FIG. 7A illustrates a method of mapping in first-axis prioritized manner. Specifically, mapping in first-axis prioritized manner refers to mapping based on the following procedure (or repetition based on the following procedure). (1) For a single point (single row) in the second axis, mapping in the direction of the first axis is performed. (2) For the next single point in the second axis, mapping in the direction of the first axis is performed.

For example, in a case that the first axis is a time axis and the second axis is a frequency axis, mapping in first-axis prioritized manner means mapping in time-axis prioritized manner (Time first mapping). In contrast, mapping in second-axis prioritized manner means mapping in frequency-axis prioritized manner (Frequency first mapping).

Here, the number of columns in the first axis may be 32, and the number of rows in the second axis may be the smallest integer value satisfying a condition that the number of rows in the second axis is not smaller than a value obtained by dividing the coded bits by 32. In a case that the coded bits are mapped in first-axis prioritized manner, null (or a dummy bit) may be mapped to an element to which any of the coded bits is not mapped.

For example, the Sub-block interleaver unit 4003 may have a function of performing different kinds of processing depending on input. In a case that an input is $d_k^{(0)}$ or $d_k^{(1)}$, a Permutation pattern may not necessarily be applied to block B. In contrast, in a case that an input is $d_k^{(2)}$, the Permutation pattern may be applied to block B. In other words, the Sub-block interleaver unit 4003 may switch the Permutation pattern to be applied, based on input coded bits. Application of the Permutation pattern may be processing for rearranging the order at the first axis. For example, Permutation pattern P may be P=[0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31].

For example, each of the Sub-block interleaver units 4003 may acquire (read out) coded bits mapped to block B in second-axis prioritized manner. Here, the mapping method illustrated in FIG. 7B illustrates a method of mapping in second-axis prioritized manner. The Sub-block interleaver unit 4003 outputs rearranged bits acquired in second-axis prioritized manner (e.g., $v_k^{(0)}$, $v_k^{(1)}$, and $v_k^{(2)}$).

For example, in a case that coded bits are mapped in first-axis prioritized manner and read out in second-axis prioritized manner, the orders of the coded bits input to the Sub-block interleaver unit 4003 and the rearranged bits are switched. In other words, the Sub-block interleaver unit 4003 may have a function of switching the orders of the coded bits and the rearranged bits. Here, the operation performed by the Sub-block interleaver unit 4003 in a case that the axis prioritized in a case of mapping to block B and the axis prioritized in a case of acquiring from block B are different is also referred to as arrangement switching (or interleave, remapping, or the like). Note that, in a case that the axis prioritized in a case of mapping to block B and the axis prioritized in a case of acquiring from block B are the same, arrangement switching is not performed by the Sub-block interleaver unit 4003 the orders of the coded bits input to the Sub-block interleaver unit 4003 and the rearranged bits are not interchanged).

For example, whether or not arrangement switching for the coded bits by the Sub-block interleaver unit 4003 is performed may be determined based on the prescribed condition 401.

Here, the axis prioritized for mapping in the arrangement switching for the coded bits may be the time axis (Time first mapping). Alternatively, the axis prioritized for mapping in the arrangement switching for the coded bits may be the frequency axis (Frequency first mapping).

The rearranged bits or the coded bits are input to the Bit collection unit 4004. The Bit collection unit 4004 has a function of generating a Virtual circular buffer, based on rearranged bits. The virtual circular buffer $w_k$ is generated based on $w_k = v_k^{(0)}$, $w_{K_\Pi + 2k} = v_k^{(1)}$, $w_{K_\Pi + 2k + 1} = v_k^{(2)}$. Here, $K_\Pi$ denotes the number of elements of entire block B, and $K_w$ denotes a value expressed by $K_w = 3K_\Pi$. The Bit collection unit 4004 outputs the virtual circular buffer $w_k$.

The virtual circular buffer is input to the Bit selection and pruning unit 4005. The Bit selection and pruning unit 4005 has a function of selecting bits in the virtual circular buffer, based on the number of radio resources. Here, the number of radio resources may be the number of resource elements given based on scheduling information. Here, the number of resource elements may be given by the product of the number of allocated subcarriers and the number of allocated symbols. The number of allocated subcarriers and the number of allocated symbols may be given based on information included in a DCI transmitted from the base station apparatus 3. The number of resource elements may be given as a value obtained by subtracting resource elements included in a prescribed region from the product of the number of allocated subcarriers and the number of allocated symbols. Here, the prescribed region may be a region including a reference signal channel. Alternatively, the prescribed region may be a region including a synchronization channel. Selection of bits in the virtual circular buffer may be performed by circularly acquiring a bit in the virtual circular buffer $w_k$ with an index $k_0$ as a starting point. Here, the acquired bit is also referred to as $e_k$. The Bit selection and pruning unit 4005 outputs $e_k$. For example, $k_0$ may be expressed as $k_0 = 32 * (2 * \text{Ceil}(N_{cb}/(8 * R^{TC})) * rv_{idx} + 2)$. Here, Ceil(*) denotes a function for acquiring the smallest integer within a condition of not being smaller than *. $rv_{idx}$ denotes a Redundancy version. The Redundancy version is determined based on MCS information included in the DCI transmitted from the base station apparatus 3 and/or a New Data Indicator (NDI). $N_{cb}$ denotes a soft buffer size. $N_{cb}$ may be $N_{cb} = \min(\text{floor}(N_{IR}/C'), K_w)$ in a case of downlink communication and may be $N_{cb} = K_w$ in a case of uplink communication. Here, min(A, B) denotes a function of selecting the smaller one of A and B. floor(*) is the greatest integer that does not exceed *.

$e_k$ is input to the Concatenation unit 4006. The Concatenation unit 4006 has a function of concatenating C' code blocks and thereby generating concatenated bits. The concatenated bits are also referred to as $f_k$.

In the following, processing of the coding 3001 will be described by taking a case of uplink as an example. Even in a case of downlink communication, the coding 3001 may have a configuration of including at least one of the Control and data multiplexing unit 4007 and/or the Channel interleaver unit 4008.

Figure 8:
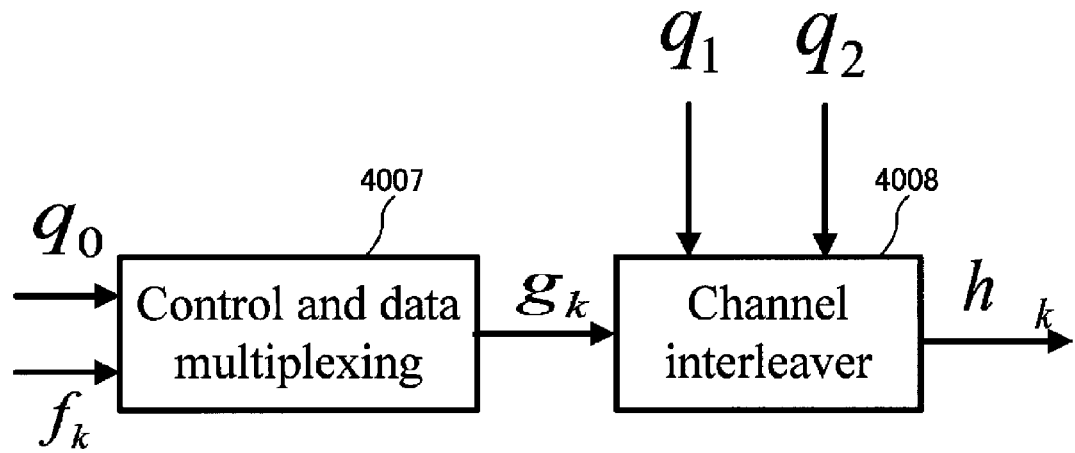
FIG. 8 is a diagram illustrating part of a configuration example of a Control and data multiplexing unit 4007 and a Channel interleaver unit 4008 included in a coding 3001 in uplink according to the present embodiment.

FIG. 8 is a diagram illustrating part of a configuration example of the Control and data multiplexing unit 4007 and the Channel interleaver unit 4008 included in the coding 3001 in uplink according to the present embodiment. In uplink, the coding 3001 includes at least one of the Control and data multiplexing unit 4007 and/or the Channel interleaver unit 4008. For example, the concatenated bits $f_k$ output from the Concatenation unit 4006 in the coding 3001 may be input to the Control and data multiplexing unit 4007 in the coding 3001 together with Uplink Control Information (UCI). Here, uplink control information input to the Control and data multiplexing unit 4007 is also referred to as $q_0$. $q_0$ may be coded bits of Channel State Information (CSI), for example. The channel state information may include Channel Quality Information (CQI), a Precoding Matrix Indicator (PMI), and a Rank Indicator (RI). $q_0$ may be coded bits of ACKnowledgement (ACK) in downlink communication, for example. The Control and data multiplexing unit 4007 may multiplex $f_k$ and $q_0$ and output multiplexed bits $g_k$. In a case that $q_0$ is not input to the Control and data multiplexing unit 4007, the multiplexed bits $g_k$ output from the Control and data multiplexing unit 4007 may be $g_k=f_k$.

For example, the multiplexed bits $g_k$ may be input to the Channel interleaver unit 4008 in the coding 3001. Here, coded bits $q_1$ in uplink control information and/or coded bits $q_2$ in uplink control information may be input to the Channel interleaver. The Channel interleaver unit 4008 may map the multiplexed bits $g_k$ to block $B_1$. Here, block $B_1$ is the same as block B except for the number of columns and the number of rows of block B. For example, the number of columns $C_{mux}$ on the first axis in block $B_1$ may be 12. The number of rows $R'_{mux}$ on the second axis may be $H/C_{mux}$. Here, H may be the number of bits $g_k+q_1$. $C_{mux}$ and $R'_{mux}$ may be given so as to satisfy a relationship of $H=C_{mux}*R'_{mux}$. A single element of block $B_1$ may be a single multiplexed bit (or correspond to a single multiplexed bit).

In a case that $q_1$ is input to the Channel interleaver unit 4008, the Channel interleaver unit 4008 maps $q_1$ to prescribed elements of block $B_1$. The prescribed elements may be elements indicated by positions defined in advance. Alternatively, the prescribed elements may be given based on information included in higher layer signaling. The prescribed elements may be given based on information included in a control channel. In block $B_1$ in the Channel interleaver unit 4008, a single element may correspond to a single group. The single group may include coded bits the number of which is the same as the order of modulation of a modulation scheme corresponding to a transport block.

The Channel interleaver unit 4008 may map $g_k$ to block $B_1$ in first-axis prioritized manner. The Channel interleaver unit 4008 may not necessarily map $g_k$ to the elements to which $q_1$ is mapped.

In a case that $q_2$ is input to the Channel interleaver unit 4008, the Channel interleaver unit 4008 maps $q_2$ to prescribed elements. The prescribed elements may be positions defined in advance. Alternatively, the prescribed elements may be given based on information included in higher layer signaling. The prescribed elements may be given based on information included in a control channel. Here, in a case that $q_1$ or $g_k$ is already mapped to the prescribed elements, $q_1$ or $g_k$ may be punctured. Here, the prescribed elements to which $q_1$ is mapped and the prescribed elements to which $q_2$ is mapped may be different from each other.

The Channel interleaver unit 4008 may read out the elements mapped in block $B_1$ in second-axis prioritized manner (that is, arrangement switching may be performed). The Channel interleaver unit 4008 may read out the elements mapped in block $B_1$ in first-axis prioritized manner (that is, arrangement switching may not necessarily be performed). The elements read out by the Channel interleaver unit 4008 are also referred to as $h_k$.

For example, whether or not arrangement switching for the multiplexed bits by the Channel interleaver unit 4008 is performed may be determined based on the prescribed condition 401.

Here, the axis prioritized for mapping in the arrangement switching for the multiplexed bits may be a time axis (Time first mapping). In other words, the first axis may be a time axis. Alternatively, the axis prioritized for mapping in the arrangement switching for the coded bits may be a frequency axis (Frequency first mapping). In other words, the second axis may be a frequency axis.

For example, the Resource element mapper 3007 may perform processing for mapping transmission bits to resource elements. The resource elements may correspond to elements mapped to block $B_2$. Here, block $B_2$ may be a subframe (or part of a subframe). Alternatively, block $B_2$ may be a slot (or part of a slot). Block $B_2$ may correspond to one or multiple OFDM symbols. The Resource element mapper 3007 may map transmission bits in first-axis prioritized manner or in second-axis prioritized manner. Here, block $B_2$ is the same as block B except for the number of columns and the number of rows of block $B_2$. At least one of the first axis and the second axis of block $B_2$ may be a frequency axis. At least one of the first axis and the second axis of block $B_2$ may be a time axis.

A processing block having a function of mapping and/or reading an information sequence (e.g., coded bits, multiplexed bits, transmission bits, or the like) to and/or from any of block B, block $B_1$, and block $B_2$ is also referred to as a mapping unit. Block B, block $B_1$, and block $B_2$ are also collectively referred to as a mapping region.

The Resource element mapper 3007 may apply frequency hopping to mapping of transmission bits to resource elements. Frequency hopping may be slot hopping. Slot hopping may be a scheme in which radio signals in two slots included in a single subframe are transmitted at different frequencies.

Whether or not frequency hopping is applied to mapping of resource elements may be based on information included in higher layer signaling. Whether or not frequency hopping is applied to mapping of resource elements may be based on information included in a control channel. Whether or not frequency hopping is applied to mapping of resource elements may be based on information configured in advance.

For example, whether transmission bits are mapped by the Resource element mapper 3007 in first-axis prioritized manner or second-axis prioritized manner may be given based on the prescribed condition 401.

Here, the first axis may be a time axis, and the second axis may be a frequency axis, for example. Alternatively, the first axis may be a frequency axis, and the second axis may be a time axis.

Hereinafter, carrier aggregation will be described.

Here, one or multiple serving cells may be configured for the terminal apparatus 1. A technology in which the terminal apparatus 1 communicates via the multiple serving cells is referred to as cell aggregation or carrier aggregation.

One or multiple configured serving cells may include one primary cell and one or multiple secondary cells. The primary cell may be a serving cell on which an initial connection establishment procedure has been performed, a serving cell in which a connection re-establishment procedure has been started, or a cell indicated as a primary cell during a handover procedure. Here, the primary cell may be a cell used for transmission on the PUCCH. Here, upon an RRC connection being established or later, a secondary cell(s) may be configured.

A carrier corresponding to a serving cell in the downlink is referred to as a downlink component carrier. A carrier corresponding to a serving cell in the uplink is referred to as an uplink component carrier. The downlink component carrier and the uplink component carrier are collectively referred to as a component carrier.

The terminal apparatus 1 may simultaneously perform transmission and/or reception on multiple physical channels in one or multiple serving cells (component carrier(s)). Here, transmission of one physical channel may be performed in one serving cell (component carrier) of the multiple serving cells (component carriers).

Here, the base station apparatus 3 may configure one or multiple serving cells through higher layer signaling (e.g., RRC signalling). For example, one or multiple secondary cells may be configured to form a set of multiple serving cells with a primary cell.

The base station apparatus 3 may activate or deactivate one or multiple serving cells through higher layer signaling (e.g., a MAC control element). For example, the base station apparatus 3 may activate or deactivate one or multiple serving cells among one or multiple serving cells configured through RRC signalling. Here, the terminal apparatus 1 may transmit CSI (e.g., aperiodic CSI) only for an activated serving cell.

Linking may be defined between uplink (e.g., uplink component carrier) and downlink (e.g., the downlink component carrier). Specifically, based on the linking between uplink and downlink, the serving cell for the uplink grant (serving cell on which (s)PUSCH transmission scheduled via uplink grant (uplink transmission) is performed) may be identified. Here, in this case, there is no carrier indicator field in the downlink assignment or the uplink grant.

In other words, the downlink assignment received in the primary cell may correspond to downlink transmission in the primary cell. Moreover, the uplink grant received in the primary cell may correspond to uplink transmission in the primary cell. The downlink assignment received in the secondary cell may correspond to downlink transmission in the secondary cell. Moreover, the uplink grant received in a secondary cell may correspond to uplink transmission in this secondary cell.

As described above, HARQ-ACK indicates ACK or NACK. The terminal apparatus 1 or the base station apparatus 3 determines, depending on whether a signal is successfully received (demodulated and decoded), ACK or NACK for the signal. ACK indicates that the terminal apparatus 1 or the base station apparatus 3 has successfully received the signal, and NACK indicates that the terminal apparatus 1 or the base station apparatus 3 has failed to receive the signal. The terminal apparatus 1 or the base station apparatus 3 that has received feedback indicating NACK may retransmit the signal corresponding to NACK. The terminal apparatus 1 determines whether or not to retransmit the PUSCH, based on the content of HARQ-ACK for the PUSCH transmitted from the base station apparatus 3. The base station apparatus 3 determines whether or not to retransmit the PDSCH, based on the content of HARQ-ACK for the PDSCH or the PDCCH/EPDCCH transmitted from the terminal apparatus. HARQ-ACK for the PUSCH transmitted from the terminal apparatus 1 is provided as feedback to the terminal apparatus on the PDCCH or the PHICH. HARQ-ACK for the PDSCH or the PDCCH/EPDCCH transmitted from the base station apparatus 3 is provided as feedback to the base station apparatus 3 on the PUCCH or the PUSCH.

A description will be given below of transmission timing of HARQ-ACK for downlink transmission (PDSCH) according to the present embodiment. In the present embodiment, the description will be given by assuming a case in which a normal CP is attached to OFDM symbols and/or SC-FDMA symbols (that is, a case in which one slot is constituted of seven symbols, a case in which one subframe is constituted of 14 symbols). However, the present embodiment may similarly be applied to a case in which an extended CP is attached.

As transmission timing of HARQ-ACK for the PDSCH, the terminal apparatus 1 transmits, in a case that the terminal apparatus 1 has detected the PDSCH in subframe n-j for the FDD, HARQ-ACK for the PDSCH in subframe n. In other words, the transmission timing of HARQ-ACK for the PDSCH is a j-th subframe after the subframe in which the PDSCH is transmitted.

Next, a description will be given below of transmission timing of the PUSCH for an uplink grant according to the present embodiment.

As transmission timing of the PUSCH for the uplink grant, the terminal apparatus 1 transmits, in a case that the terminal apparatus 1 has detected the PDCCH (uplink grant) in subframe n for the FDD, the PUSCH for the uplink grant in subframe n+k. In other words, the transmission timing of the PUSCH for the uplink grant is the k-th subframe after the subframe in which the uplink grant is detected.

As described above, the transmission timing of HARQ-ACK for the PDSCH and the transmission timing of the PUSCH for the uplink grant may be four subframes. The transmission timing may be referred to also as normal timing. For the FDD, k and j may be 4. k and j being 4 may be referred to as normal timing.

The value of k and/or j may be a value smaller than 4. For example, the value of k and/or j may be 2. For example, the value of k and/or j may be 3. The value of k and/or j may be determined based on processing capability of the terminal apparatus 1. k and j having a value smaller than 4 may also be referred to as reduced timing.

Here, the processing capability of the terminal apparatus 1 may be indicated by capability information of the terminal apparatus 1. The terminal apparatus 1 may notify the base station apparatus 3 of (transmit) the capability information.

The capability information of the terminal apparatus 1 will be described below. The capability information of the terminal apparatus 1 may be defined as information on capability of the terminal apparatus 1.

For example, the capability information of the terminal apparatus 1 may indicate actual time in which the terminal apparatus 1 processes data. The processing time may be determined based on time required for reception and decoding of a detected signal and time required for generation (modulation and coding) of a signal to be transmitted. Specifically, the capability information of the terminal apparatus 1 may indicate actual processing time (e.g., millisecond order) for HARQ-ACK for the PDSCH. The processing time for the HARQ-ACK for the PDSCH may be time required for processing from reception and detection (decoding, blind decoding) for the PDCCH for scheduling of the PDSCH to generation (modulation and coding) of the HARQ-ACK. The capability information of the terminal apparatus 1 may indicate actual processing time (e.g., millisecond order) for the PUSCH for an uplink grant. The processing time for the PUSCH for the uplink grant may be time required for processing from reception and detection (decoding, blind decoding) for the uplink grant for scheduling of the PUSCH to generation (modulation and coding) of the PUSCH.

The capability information of the terminal apparatus 1 may indicate capability of the terminal apparatus 1 to support sTTI constituted of less than 14 OFDM symbols and/or SC-FDMA symbols.

The capability information of the terminal apparatus 1 may indicate category information of the terminal apparatus 1. The category information of the terminal apparatus 1 may include information of the capability of the terminal apparatus 1 to reduce processing time. The category information of the terminal apparatus 1 may include transmission timing (values of k and j) that the terminal apparatus 1 can support.

The base station apparatus 3 may determine the transmission timings (values of k and j) that can be used by the terminal apparatus 1, based on the capability information transmitted from the terminal apparatus 1. The transmission timings (values of k and j) may be configured as higher layer parameters. The base station apparatus 3 may transmit RRC signalling including the transmission timings (values of k and j) that can be used by the terminal apparatus 1, to the terminal apparatus 1.

The transmission timings (values of k and j) may be values defined in a specification or the like and known to the base station apparatus 3 and the terminal apparatus 1.

In the present embodiment below, the values of k and j may be defined with reference to the number of subframes. For example, each of the values of k and j may be 2, 3, or 4. The values of k and j may be represented by the numbers of symbols (OFDM symbols and/or SC-FDMA symbols). For example, the values of k and j expressed by the numbers of symbols may be determined based on the relationship between subframes and symbols in FIG. 3. The values of k and j expressed by the numbers of symbols may be prescribed values. The values of k and j may be determined based on the length of TTI. The TTI may include sTTI.

Transport Block Size (TBS) relating to the present embodiment will be described below.

The TBS indicates the number of bits in the transport block. As described above, the uplink grant includes DCI format 0 and DCI format 4. DCI format 0 includes at least (a) 'Resource block assignment and hopping resource allocation' field, (b) 'Modulation and coding scheme and redundancy version' field, and (c) 'New data indicator' field. DCI format 4 includes at least d) 'Resource block assignment' field, (e) 'Modulation and coding scheme and redundancy version' field for transport block 1, (f) 'New data indicator' field for transport block 1, (g) 'Modulation and coding scheme and redundancy version' field for transport block 2, and (h) 'New data indicator' field for transport block 2.

The terminal apparatus 1 determines an MCS index ($I_{MCS}$) for the PUSCH, based on (b) 'Modulation and coding scheme and redundancy version' field, (e) 'Modulation and coding scheme and redundancy version' field for transport block 1, or (g) 'Modulation and coding scheme and redundancy version' field for transport block 2. The terminal apparatus 1 determines a modulation degree ($Q_m$) for the PUSCH, a transport block size index ($I_{TBS}$) for the PUSCH, and a redundancy version ($rv_{idx}$) for the PUSCH with reference to the MCS index ($I_{MCS}$) for the determined PUSCH.

The terminal apparatus 1 calculates the total number ($N_{PRB}$) of physical resource blocks assigned to the PUSCH, based on (a) 'Resource block assignment and hopping resource allocation' field or (d) 'Resource block assignment' field.

Specifically, the terminal apparatus 1 determines the transport block size (TBS) for the PUSCH with reference to the calculated total number ($N_{PRB}$) of physical resource blocks assigned to the PUSCH and the determined MCS index ($I_{MCS}$) for the PUSCH.

Similarly, the terminal apparatus 1 may determine the transport block size (TBS) for the PDSCH with reference to the total number ($N_{PRB}$) of physical resource blocks assigned to the PDSCH and the MCS index ($I_{MCS}$) for the PDSCH. Here, the total number ($N_{PRB}$) of physical resource blocks assigned to the PDSCH may be calculated based on the 'Resource block assignment' field included in the downlink grant. The MCS index ($I_{MCS}$) for the PDSCH may be indicated by the 'Modulation and coding scheme' field included in the downlink grant. The terminal apparatus 1 determines a modulation degree ($Q_m$) for the PDSCH and a transport block size index ($I_{TBS}$) for the PDSCH with reference to the indicated MCS index ($I_{MCS}$) for the PDSCH.

Figure 9:
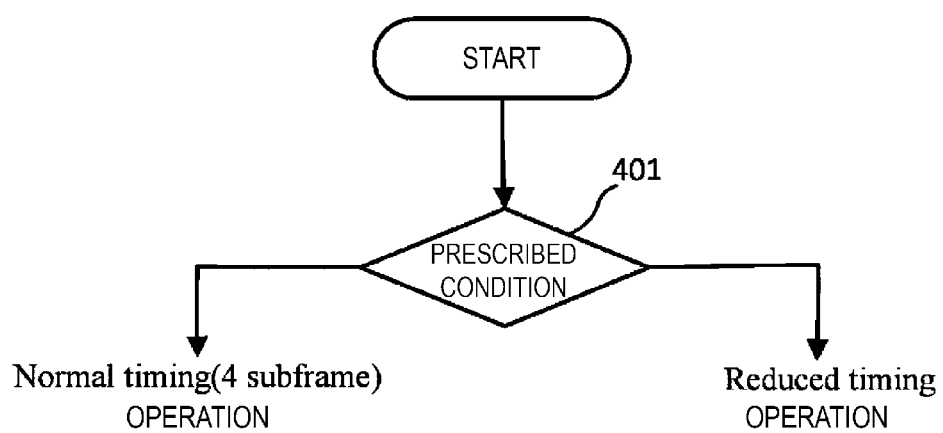
FIG. 9 is a diagram illustrating PUSCH or HARQ-ACK transmission timings according to the present embodiment.

FIG. 9 is a diagram illustrating PUSCH or HARQ-ACK transmission timings according to the present embodiment. In other words, the terminal apparatus 1 and the base station apparatus 3 may be given transmission timings (values of k and j), based on a prescribed condition 401. Basically, operations of the terminal apparatus 1 will be described below. However, it goes without saying that the base station apparatus 3 performs similar operations in response to the operations of the terminal apparatus 1.

As illustrated in FIG. 9, the terminal apparatus 1 may determine (switch) either a normal timing operation or a Reduced timing operation, based on the prescribed condition 401. Specifically, in a case that the terminal apparatus 1 determines the operation to be the normal timing operation, the terminal apparatus 1 may perform data transmission by using k or j having a value of 4. In a case that the terminal apparatus 1 determines the operation to be the reduced timing operation, the terminal apparatus 1 may perform data transmission by using k or j having a value smaller than 4.

Here, data transmission may include transmission on the PUSCH. The data transmission may include HARQ-ACK transmission.

Concretely, the normal timing operation may include transmission on the PUSCH in the k-th subframe after the subframe in which the uplink grant is detected (received). The normal timing operation may include transmission of the HARQ-ACK on the PUCCH in the j-th subframe after the subframe in which the PDSCH is detected. In other words, in the case of the normal timing operation, k and j are 4.

Here, the normal timing operation may include configuring the maximum code block length Z of a transport block at a prescribed value (a prescribed maximum code block length for the normal timing operation). Here, the transport block may be a transport block included in the PDSCH. Alternatively, the transport block may be a transport block included in the PUSCH. The transport block may be a transport block included in the PDSCH scheduled using the PDCCH. The transport block may be a transport block included in the PUSCH scheduled using the PDCCH. Here, the prescribed maximum code block length for the normal timing operation may be given based on description in a specification or the like. The prescribed maximum code block length for the normal timing operation may be 6144.

Here, the normal timing operation may include the Channel interleaver unit 4008 performing arrangement switching for multiplexed bits. Here, the multiplexed bits may be multiplexed bits included in a transport block. The multiplexed bits may be multiplexed bits included in a transport block included in the PUSCH. The multiplexed bits may be multiplexed bits included in a transport block included in the PUSCH scheduled using the PDCCH.

Here, the normal timing operation may include the Resource element mapper 3007 mapping transmission bits in frequency-axis prioritized manner (Frequency first mapping). Here, the transmission bits may be multiplexed bits included in a transport block. The transmission bits may be multiplexed bits included in a transport block included in the PUSCH. The transmission bits may be multiplexed bits included in a transport block included in the PUSCH scheduled using the PDCCH.

The Reduced timing operation may include transmission on the PUSCH in the k-th subframe after the subframe in which the uplink grant is detected (received). The Reduced timing operation may include transmission of the HARQ-ACK on the PUCCH in the j-th subframe after the subframe in which the PDSCH is detected. In other words, in the case of the Reduced timing operation, k and j are values smaller than 4.

Here, the value of k and/or j may be a value defined in advance based on the capability information of the terminal apparatus 1. For example, the value of k and/or j may be 2. The value of k and/or j may be 3. In other words, the reduced timing operation can perform PUSCH or HARQ-ACK transmission earlier than four subframes corresponding to the normal timing. The values of k and j in the case of the reduced timing operation may be smaller than the values of k and j in the case of the normal timing.

Here, the Reduced timing operation may include configuring the maximum code block length Z of a transport block at a value different from the prescribed maximum code block length for the normal timing operation. For example, the Reduced timing operation may include configuring the maximum code block length Z of a transport block at a value smaller than the prescribed maximum code block length for the normal timing operation. Alternatively, for example, the Reduced timing operation may include configuring the maximum code block length Z of a transport block at a value greater than the prescribed maximum code block length for the normal timing operation. Here, the transport block may be a transport block included in the PDSCH. Alternatively, the transport block may be a transport block included in the PUSCH. The transport block may be a transport block included in the PDSCH scheduled using the PDCCH. The transport block may be a transport block included in the PUSCH scheduled using the PDCCH.

Here, the Reduced timing operation may include the Channel interleaver unit 4008 not performing arrangement switching for multiplexed bits. The multiplexed bits may be multiplexed bits included in a transport block. The multiplexed bits may be multiplexed bits included in a transport block included in the PUSCH. The multiplexed bits may be multiplexed bits included in a transport block included in the PUSCH scheduled using the PDCCH.

Here, the Reduced timing operation may include the Resource element mapper 3007 mapping transmission bits in time-axis prioritized manner (Time first mapping). Here, the transmission bits may be multiplexed bits included in a transport block. The transmission bits may be multiplexed bits included in a transport block included in the PUSCH. The transmission bits may be multiplexed bits included in a transport block included in the PUSCH scheduled using the PDCCH.

The Reduced timing operation may include the Resource element mapper 3007 mapping transmission bits in frequency-axis prioritized manner (Frequency first mapping).

The prescribed condition 401 in FIG. 9 may include at least one of a first condition to a fifth condition below. The terminal apparatus 1 may determine a transmission timing operation, based on part of or all the first condition to the fifth condition below.

(1) First condition: whether a search space in which the PDCCH is detected is CSS or USS. Here, the PDCCH is a PDCCH used for scheduling of the PDSCH or the PDCCH used for scheduling of the PUSCH to which HARQ-ACK corresponds.

(2) Second condition: by which RNTI CRC parity bits are scrambled, the CRC parity bits being attached to DCI format. Here, the DCI format is the DCI format included in the PDCCH to be used for scheduling of the PDSCH to which HARQ-ACK corresponds or the DCI format included in the PDCCH to be used for scheduling of the PUSCH.

(3) Third condition: whether TBS to be processed is greater than the maximum TBS threshold. Here, the TBS to be processed indicates the size of transport block included in the PDSCH or the size of transport block included in the PUSCH.

(4) Fourth condition: whether the value of Timing Advance (TA, Timing Alignment) is greater than a maximum TA threshold.

(5) Fifth condition: whether a higher layer parameter indicating that the Reduced timing is active is configured.

(6) Sixth condition: whether to transmit a channel including a higher layer parameter indicating having reduced timing capability.

Here, the first condition may be whether or not a position at which the PDCCH including a DCI format is detected is a prescribed position (a prescribed position for the Reduced timing operation). Here, the prescribed position may be a logical position given based on an index. The position at which the PDCCH including the DCI format is detected may be given based, for example, on whether or not a CCE index of the PDCCH is a prescribed CCE index $I_{AL,\ INDEX}$. The position at which the PDCCH including the DCI format is detected may be given based on the aggregation level of candidates for the PDCCH.

Specifically, in the first condition, the terminal apparatus 1 determines an operation, based on whether a search space in which the PDCCH is detected is CSS or USS. For example, in a case that the search space in which the PDCCH is detected is CSS, at least part of or all the normal timing operation may be performed. For example, in a case that the search space in which the PDCCH is detected is USS, at least part of or all the Reduced timing operation may be performed.

In the first condition, in a case that the CCE index $I_{AL,\ INDEX}$ with which the PDCCH including the DCI format is detected is the prescribed CCE index $I_{PRE}$, the terminal apparatus 1 may perform at least part of or all the Reduced timing operation. In a case that the CCE index $I_{AL,\ INDEX}$ with which the PDCCH including the DCI format is detected is different from the prescribed CCE index $I_{PRE}$, the terminal apparatus 1 may perform at least part of or all the normal timing operation. Here, $I_{PRE}$ may be a value given based on a description in a specification or the like.

In the first condition, in a case that the aggregation level of the detected PDCCH including the DCI format is a prescribed aggregation level, the terminal apparatus 1 may perform at least part of or all the Reduced timing operation. In a case that the aggregation level of the detected PDCCH including the DCI format is different from the prescribed aggregation level, the terminal apparatus 1 may perform at least part of or all the normal timing operation. Here, the prescribed aggregation level may be part of or all 1, 2, 4, and 8. For example, the prescribed aggregation level may be an aggregation level equal to or smaller than N (or smaller than N). Alternatively, the prescribed aggregation level may be an aggregation level equal to or greater than N (or greater than N). Here, N is a constant value.

In the second condition, the terminal apparatus 1 determines an operation based on by which RNTI CRC parity bits are scrambled, the CRC parity bits being attached to the DCI format. For example, in a case that CRC parity bits attached to the DCI format are scrambled with any of the following RNTIs, the terminal apparatus 1 may perform at least part of or all the normal timing operation.

(a) Temporary C-RNTI (b) P-RNTI (c) SI-RNTI

For example, in a case that CRC parity bits attached to the DCI format are scrambled with either of the following RNTIs, the terminal apparatus 1 may perform at least part of or all the Reduced timing operation.

(d) C-RNTI (e) SPS-RNTI

To allow at least part of or all the normal timing operation to be performed, a new RNTI type (e.g., X-RNTI) may be defined. In a case that CRC parity bits attached to the DCI format are scrambled with X-RNTI, the terminal apparatus 1 may perform at least part of or all the normal timing operation. The X-RNTI may be C-RNTI.

To allow at least part of or all the Reduced timing operation to be performed, a new RNTI type (e.g., Y-RNTI) may be defined. In a case that CRC parity bits attached to the DCI format are scrambled with Y-RNTI, the terminal apparatus 1 may perform at least part of or all the Reduced timing operation. Here, Y-RNTI may be a value common to a group of the terminal apparatuses 1 to which at least part of or all the Reduced timing operation is applied, or all.

In a case that X-RNTI and Y-RNTI are configured for the terminal apparatus 1 through higher layer signaling, whether at least part of or all the normal timing operation and at least part of or all the reduced timing operation is to be performed may be switched based on the second condition.

Alternatively, the terminal apparatus 1 determines an operation, depending on whether the TBS to be processed is greater than the maximum TBS threshold in the third condition. For example, in a case that the TBS to be processed is greater than the maximum TBS threshold, at least part of or all the normal timing operation may be performed. In contrast, in a case that the TBS to be processed is not greater than the maximum TBS threshold, at least part of or all the Reduced timing operation may be performed. Here, the maximum TBS threshold may be a value defined in a specification or the like and known to the base station apparatus 3 and the terminal apparatus 1. The base station apparatus 3 may transmit RRC signalling including the maximum TBS threshold, to the terminal apparatus 1.

Here, the TBS to be processed may be (i) bandwidth configured for the terminal apparatus 1 (transmission bandwidth allocated to PDSCH transmission or PUSCH transmission) and (ii) TBS determined based on the MCS configured for the terminal apparatus 1 (or greatest TBS value). In other words, the TBS to be processed may be determined based on (i) bandwidth configured for the terminal apparatus 1 (transmission bandwidth allocated to PDSCH transmission or PUSCH transmission) and (ii) MCS configured for the terminal apparatus 1. The TBS to be processed may be TBS determined based on the MCS configured for the terminal apparatus 1 (or greatest TBS value). In other words, the TBS to be processed may be determined based on the MCS configured for the terminal apparatus 1. The bandwidth configured for the terminal apparatus 1 (transmission bandwidth allocated to PDSCH transmission or PUSCH transmission) may be based on scheduling information. Scheduling information may be resource allocation information included in the DCI format for scheduling of the PDSCH or the PUSCH. In other words, the TBS to be processed may be TBS calculated based on the DCI format for scheduling of the PDSCH or the PUSCH. The scheduling information may be resource allocation information included in the DCI, the PDCCH, the EPDCCH, or the RRC signalling.

The terminal apparatus 1 may compare the maximum TBS threshold and the TBS to be processed by the terminal apparatus 1. The maximum TBS threshold may be the greatest value of the TBSs possible to be processed by the terminal apparatus 1. The maximum TBS threshold may be defined for each of the values of k or j. For example, the maximum TBS thresholds corresponding to different values of k or j may be different. In other words, the maximum TBS threshold may be determined based on the bandwidth (or system bandwidth). The maximum TBS threshold may be determined based on the capability information of the terminal apparatus 1.

The terminal apparatus 1 determines an operation, based on whether Timing Advance (TA, Timing Alignment) is greater than the maximum TA threshold in the fourth condition. For example, in a case that the TA is greater than the maximum TA threshold, at least part of or all the normal timing operation may be performed. In contrast, in a case that the TA is not greater than the maximum TA threshold, at least part of or all the Reduced timing operation may be performed.

The TA may be considered to indicate the distance between the terminal apparatus 1 and the base station apparatus 3. The TA value is a variable value in accordance with the distance between the terminal apparatus 1 and the base station apparatus 3. The TA value indicates the time difference between the transmission timing of the uplink subframe and the beginning of the corresponding downlink subframe. In other words, the TA is used to adjust transmission timing (value of k and/or j) of the terminal apparatus 1. The TA value may be configured for the terminal apparatus 1 by using a TA command transmitted from the base station apparatus 3. The terminal apparatus 1 performs transmission at the time point that is a certain period before the subframe boundary between uplink subframes, based on the configured value of the TA, the certain period corresponding to the TA value. In other words, the TA value affects transmission timing (value of k and/or j).

The maximum TA threshold may be the greatest value of the TAs possible to be used by the terminal apparatus 1 for the transmission timing (value of k or j). In other words, the maximum TA threshold may be considered to limit a communicable range for each of values of k or j. The maximum TA threshold may be a value defined in a specification or the like and known to both the base station apparatus 3 and the terminal apparatus 1. The base station apparatus 3 may transmit RRC signalling including the maximum TA threshold, to the terminal apparatus 1.

In the fifth condition, "a higher layer parameter indicating that the Reduced timing is active is not configured" may include "a higher layer parameter indicating that the Reduced timing is inactive is configured". In a case that a higher layer parameter indicating that the Reduced timing is active is not configured, at least part of or all the normal timing operation may be performed. In a case that a higher layer parameter indicating that the Reduced timing is active is configured, the normal timing operation or the Reduced timing operation may be determined based at least on part of or all the first to fourth conditions above. Here, "a higher layer parameter indicating that the Reduced timing is active is not configured" may include "a higher layer parameter indicating that the Reduced timing (or Reduced timing operation) is active is configured for the terminal apparatus 1" or "the base station apparatus 3 transmits, to the terminal apparatus 1, a channel including a higher layer parameter indicating that the Reduced timing is active".

More specifically, in a case that a higher layer parameter indicating that the Reduced timing is active is not configured, the terminal apparatus 1 may perform at least part of or all the normal timing operation without being based on part of or all the first to fourth conditions above. For example, in a case that a higher layer parameter indicating that the Reduced timing is active is not configured and that the search space in which the PDCCH is detected is USS, at least part of or all the normal timing operation may be performed.

In a case that a higher layer parameter indicating that the Reduced timing is active is configured, the terminal apparatus 1 may determine the normal timing operation or the Reduced timing operation, based at least on part of or all the first to fourth conditions above. As an example, in a case that a higher layer parameter indicating that the Reduced timing is active is configured and that the search space in which the PDCCH is detected is CSS in the first condition, the terminal apparatus 1 may perform at least part of or all the normal timing operation. In a case that a higher layer parameter indicating that the Reduced timing is active is configured and that the search space in which the PDCCH is detected is USS in the first condition, the terminal apparatus 1 may perform at least part of or all the Reduced timing operation.

In the sixth condition, in a case that the terminal apparatus 1 does not transmit a channel including a higher layer parameter indicating having the Reduced timing capability, at least part of or all the normal timing operation may be performed. In a case that the terminal apparatus 1 does not transmit a channel including a higher layer parameter indicating having the Reduced timing capability, the normal timing operation or the Reduced timing operation may be determined based at least on part of or all the first to fifth conditions above.

In a case that the terminal apparatus 1 transmits a channel including a higher layer parameter indicating having the Reduced timing capability, at least part of or all the Reduced timing operation may be performed.

The terminal apparatus 1 may determine a transmission timing operation, based on a combination of the above conditions. The transmission timing operation may be given based at least on part of or all the normal timing operation. Alternatively, the transmission timing operation may be given based at least on part of or all the Reduced timing operation.

For example, in a case that the PDCCH is detected in the CSS and CRC parity bits attached to the DCI format transmitted on the PDCCH are scrambled with C-RNTI, the terminal apparatus 1 may perform at least part of or all the normal timing operation. For example, in a case that the PDCCH is detected in USS and CRC parity bits attached to the DCI format transmitted on the PDCCH are scrambled with C-RNTI, the terminal apparatus 1 may perform at least part of or all the Reduced timing operation.

Figures 10, 11A, 11B:
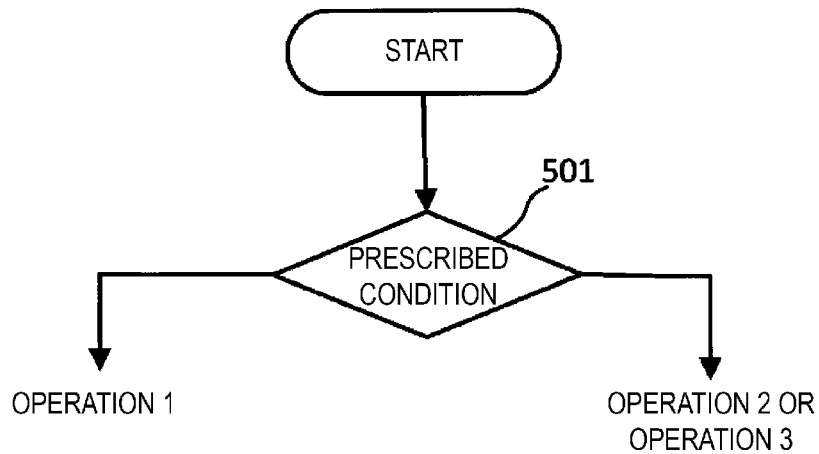
FIG. 10 is a diagram illustrating PUSCH or HARQ-ACK transmission operations according to the present embodiment.
FIG. 11A is a diagram illustrating an example of a maximum TBS threshold and a corresponding PUSCH transmission timing (value of k) according to the present embodiment.
FIG. 11B is a diagram illustrating another example of the maximum TBS threshold and the corresponding PUSCH transmission timing (value of k) according to the present embodiment.

FIG. 10 is a diagram illustrating PUSCH or HARQ-ACK transmission operations according to the present embodiment. Specifically, the terminal apparatus 1 may determine (switch) operation 1, operation 2, or operation 3, based on a prescribed condition 501. The prescribed condition 501 in FIG. 10 may include at least one of a first condition and a second condition below. The terminal apparatus 1 may make determination based on one of or both the first condition and the second condition below.

(i) First condition: whether a search space in which the PDCCH is detected is CSS or USS.

(ii) Second condition: by which RNTI CRC parity bits are scrambled, the CRC parity bits being attached to the DCI format.

Here, the first condition may be whether or not a position at which the PDCCH including a DCI format is detected is a prescribed position (a prescribed position for the Reduced timing operation). Here, the prescribed position may be a logical position given based on an index. The position at which the PDCCH including the DCI format is detected may be given based, for example, on whether the CCE index of the PDCCH is the prescribed CCE index $I_{AL, INDEX}$. The position at which the PDCCH including the DCI format is detected may be given based on an aggregation level of the PDCCH.

In the first condition, the terminal apparatus 1 determines an operation based on whether a search space in which the PDCCH is detected is CSS or USS. For example, in a case that the search space in which the PDCCH is detected is CSS, operation 1 may be performed. In contrast, for example, in a case that the search space in which the PDCCH is detected is USS, operation 2 or operation 3 may be performed.

In the first condition, in a case that the CCE index $I_{AL, INDEX}$ with which the PDCCH including the DCI format is detected is the prescribed CCE index $I_{PRE}$, the terminal apparatus 1 may perform operation 2 or operation 3. In a case that the CCE index $I_{AL, INDEX}$ with which the PDCCH including the DCI format is detected is different from the prescribed CCE index $I_{PRE}$, the terminal apparatus 1 may perform operation 1. Here, $I_{PRE}$ may be a value given based on a description in a specification or the like.

In the first condition, in a case that the aggregation level of the detected PDCCH including the DCI format is a prescribed aggregation level, the terminal apparatus 1 may perform operation 2 or operation 3. In a case that the aggregation level of the detected PDCCH including the DCI format is different from the prescribed aggregation level, the terminal apparatus 1 may perform operation 1. Here, the prescribed aggregation level may be part of or all 1, 2, 4, and 8. For example, the prescribed aggregation level may be an aggregation level equal to or smaller than N (or smaller than N). Alternatively, the prescribed aggregation level may be an aggregation level equal to or greater than N (or greater than N). Here, N is a constant value.

In the second condition, the terminal apparatus 1 determines an operation based on by which RNTI CRC parity bits are scrambled, the CRC parity bits being attached to the DCI format. For example, in a case that CRC parity bits attached to the DCI format are scrambled with any of the following RNTIs, the terminal apparatus 1 may perform operation 1.

(a) Temporary C-RNTI
(b) P-RNTI
(c) SI-RNTI

For example, in a case that CRC parity bits attached to the DCI format are scrambled with either of the following RNTIs, the terminal apparatus 1 may perform operation 2 or operation 3.

(d) C-RNTI
(e) SPS-RNTI

To allow operation 1 to be performed, a new RNTI type (e.g., X-RNTI) may be defined. In other words, in a case that CRC parity bits attached to the DCI format are scrambled with X-RNTI, the terminal apparatus 1 may perform operation 1.

To allow operation 2 or operation 3 to be performed, a new RNTI type (e.g., Y-RNTI) may be defined. In a case that CRC parity bits attached to the DCI format are scrambled with Y-RNTI, the terminal apparatus 1 may perform operation 2 or operation 3.

In a case that X-RNTI and Y-RNTI are configured for the terminal apparatus 1 through higher layer signaling, operation 1 and operation 2 or 3 to be performed may be switched based on the second condition.

The terminal apparatus 1 may determine operation 1, operation 2, or operation 3, based on a combination of the first condition and the second condition. For example, in a case that the PDCCH is detected in the CSS and CRC parity bits attached to the DCI format transmitted on the PDCCH are scrambled with the C-RNTI, the terminal apparatus 1 may perform operation 1. For example, in a case that the PDCCH is detected in the USS and CRC parity bits attached to the DCI format transmitted on the PDCCH are scrambled with the C-RNTI, the terminal apparatus 1 may perform operation 2 or operation 3.

Whether the terminal apparatus 1 performs operation 2 or operation 3 may be configured in advance by the base station apparatus 3.

The operation of the terminal apparatus 1 will be described below concretely.

Operation 1 may be an operation similar to the normal timing operation as that described above. Specifically, operation 1 may include an operation of transmission on the PUSCH in the fourth subframe after the subframe in which the terminal apparatus 1 has detected (received) the PDCCH (uplink grant, DCI format). Operation 1 may include an operation of transmission of HARQ-ACK on the PUCCH in the fourth subframe after the subframe in which the terminal apparatus 1 has detected the PDSCH.

In operation 2, the terminal apparatus 1 may determine transmission timing (value of k and/or j), based on (i) TBS calculated based on the DCI format for scheduling of the PDSCH or the PUSCH and (ii) prescribed maximum TBS threshold. Operation 2 may include transmission on the PUSCH based on the determined value of k. Operation 2 may include transmission of HARQ-ACK on the PUCCH based on the determined value of j.

Here, the prescribed maximum TBS threshold may be different from the maximum TBS threshold described in the third condition in FIG. 9. The prescribed maximum TBS threshold in operation 2 may be configured based on the capability information of the terminal apparatus 1. In other words, the prescribed maximum TBS threshold may be configured for the value of k and/or j that can be supported by the terminal apparatus 1.

The prescribed maximum TBS threshold may be configured separately based on the PUSCH transmission timing (value of k) and HARQ-ACK transmission timing (value of j). Specifically, the prescribed maximum TBS threshold may be configured based on the PUSCH transmission timing (value of k). The prescribed maximum TBS threshold may be configured based on the HARQ-ACK transmission timing (value of j). Here, the maximum TBS threshold configured for the PUSCH transmission timing and the maximum TBS threshold configured for the HARQ-ACK transmission timing may be different from each other. The prescribed maximum TBS threshold may be configured as a higher layer parameter.

Next, an example of a procedure for transmitting the PUSCH for the detected PDCCH associated with operation 2 will be described in detail. Specifically, operation 2 is an operation of determining, upon detection of the PDCCH in subframe n, a value of k at the time of performing PUSCH transmission in subframe n+k. As described above, the terminal apparatus 1 may notify the base station apparatus 3 of (transmit) the capability information. The base station apparatus 3 may configure a value of k that can be used by the terminal apparatus 1, based on the capability information of the terminal apparatus 1. The base station apparatus 3 may configure a prescribed maximum TBS threshold for the value of k. The base station apparatus 3 may transmit (notify), to the terminal apparatus 1, the prescribed maximum TBS threshold corresponding to the value of k through RRC signalling. In other words, the corresponding PUSCH transmission timing (value of k) is determined based on the TBS of the scheduled PUSCH.

FIGS. 11A and 11B are diagrams illustrating a maximum TBS threshold and a corresponding PUSCH transmission timing (value of k). Different prescribed maximum TBS thresholds may be configured for different values of k. FIG. 11A is an example of a case in which two prescribed maximum TBS thresholds are configured. FIG. 11B is an example of a case in which a single maximum TBS threshold is configured.

In FIG. 11A, the prescribed maximum TBS thresholds are configured as Max TBS1 and Max TBS2. In a case that the TBS calculated based on the DCI format is not greater than prescribed Max TBS1 threshold, the terminal apparatus 1 may determine (switch) the PUSCH transmission timing (value of k) as k1. In a case that the TBS calculated based on the DCI format is in the range from a prescribed Max TBS1 threshold to a prescribed Max TBS2 threshold, the terminal apparatus 1 may determine (switch) the PUSCH transmission timing (value of k) as k2. In a case that the TBS calculated from the DCI format is equal to or greater than the prescribed Max TBS2 threshold, the terminal apparatus 1 may determine (switch) the PUSCH transmission timing (value of k) as 4. Here, the value of k1 may be 2. The value of k2 may be 3.

In a case that the TBS calculated based on the DCI format is not greater than the prescribed Max TBS1 threshold, the terminal apparatus 1 may perform at least part of or all the Reduced timing operation. In a case that the TBS calculated based on the DCI format is within a range from the prescribed Max TBS1 threshold to the prescribed Max TBS2 threshold, the terminal apparatus 1 may perform at least part of or all the Reduced timing operation. In a case that the TBS calculated based on the DCI format is within the range from the prescribed Max TBS1 threshold to the prescribed Max TBS2 threshold, the terminal apparatus 1 may perform at least part of or all the normal timing operation. In a case that the TBS calculated based on the DCI format is equal to or greater than the prescribed Max TBS2 threshold, the terminal apparatus 1 may perform at least part of or all the normal timing operation.

In a case that the PUSCH transmission timing is switched to k1, at least part of or all the Reduced timing operation may be applied. In a case that the PUSCH transmission timing is switched to k2 or 4, at least part of or all the normal timing operation may be applied. In a case that the PUSCH transmission timing is switched to k1 or k2, at least part of or all the Reduced timing operation may be applied. In a case that the PUSCH transmission timing is switched to 4, at least part of or all the normal timing operation may be applied.

In FIG. 11B, the prescribed maximum TBS threshold is configured as Max TBS3. In a case that the TBS calculated based on the DCI format is not greater than prescribed Max TBS3, the terminal apparatus 1 may determine (switch) the PUSCH transmission timing (value of k) as k3. In a case that the TBS calculated based on the DCI format is greater than the prescribed Max TBS3 threshold, the terminal apparatus 1 may determine (switch) the PUSCH transmission timing (value of k) as 4. Here, the value of k3 may be 2. The value of k3 may be 3.

In a case that the TBS calculated based on the DCI format is not greater than the prescribed Max TBS3 threshold, the terminal apparatus 1 may perform at least part of or all the Reduced timing operation. In a case that the TBS calculated based on the DCI format is greater than the prescribed Max TBS3 threshold, the terminal apparatus 1 may perform at least part of or all the normal timing operation.

In a case that the PUSCH transmission timing is switched to k3, at least part of or all the Reduced timing operation may be applied. In a case that the PUSCH transmission timing is switched to 4, at least part of or all the normal timing operation may be applied.

Figure 12:
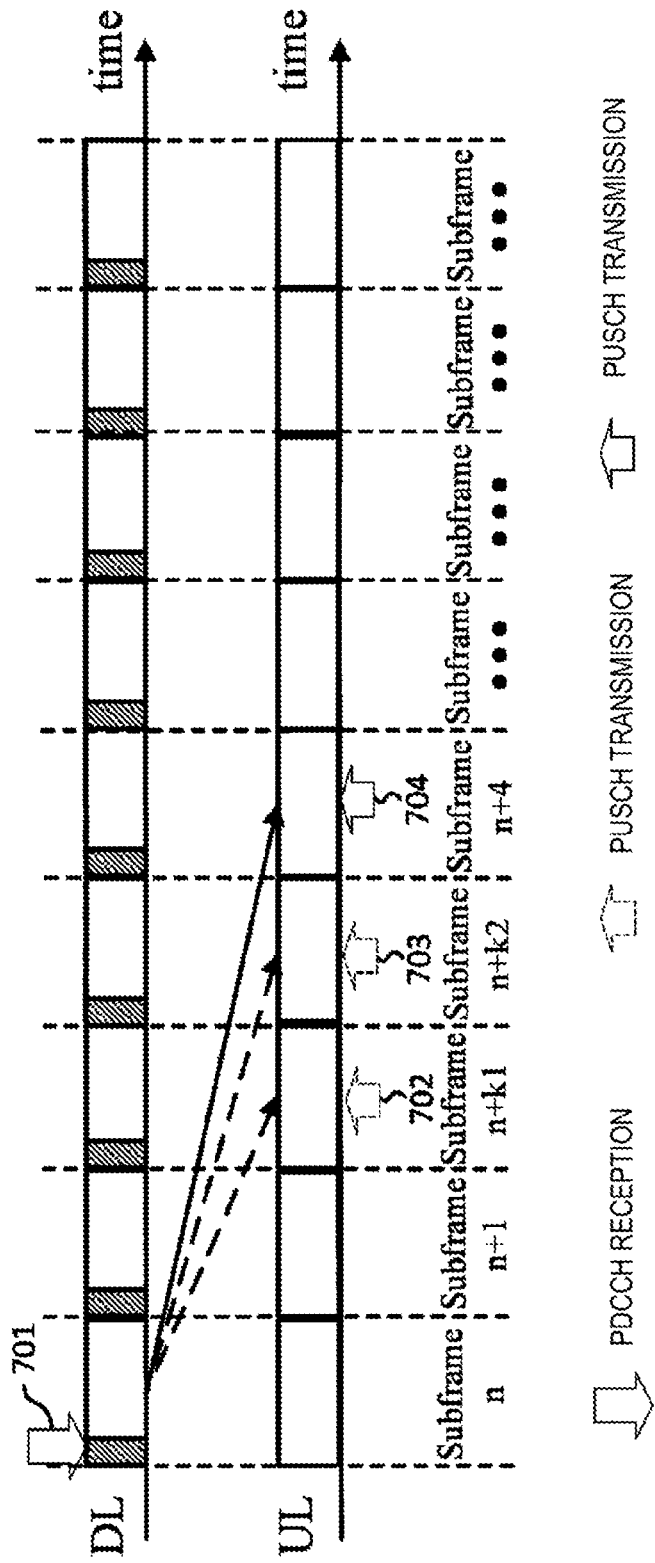
FIG. 12 is a diagram illustrating an example of a PUSCH transmission method in operation 2 according to the present embodiment.

FIG. 12 is a diagram illustrating an example of a PUSCH transmission method in operation 2. The PUSCH transmission method in FIG. 12 is assumed to be based on a condition illustrated in FIG. 11A.

The terminal apparatus 1 detects the PDCCH for scheduling of the PUSCH in downlink subframe n in 701. A TBS for PUSCH transmission is calculated based on the DCI format transmitted on the PDCCH. The terminal apparatus 1 may compare the calculated TBS and the prescribed maximum TBS threshold to determine a value of k.

For example, in a case that the calculated TBS is not greater than prescribed Max TBS1, the value of k may be determined as k1. The terminal apparatus 1 may transmit the PUSCH scheduled on the PDCCH detected in 701, in uplink subframe n+k1 in 702 by using the value of k1.

For example, in a case that the calculated TBS is in the range from prescribed Max TBS1 threshold to the prescribed Max TBS2 threshold, the value of k may be determined as k2. The terminal apparatus 1 may transmit the PUSCH scheduled on the PDCCH detected in 701, in uplink subframe n+k2 in 703 by using the value of k2.

For example, in a case that the calculated TBS is equal to or greater than prescribed Max TBS2, the value of k may be determined as 4. The terminal apparatus 1 may transmit the PUSCH scheduled on the PDCCH detected in 701, in uplink subframe n+4 in 704 by using the value of k that is 4.

Next, an example of an HARQ-ACK transmission procedure for PDSCH transmission associated with operation 2 will be described. This is an operation in which the terminal apparatus 1 determines, in a case that the PDSCH is detected in subframe n-j, a value of j at the time of performing transmission of HARQ-ACK for the PDSCH in subframe n. Similarly to the PUSCH transmission procedure associated with operation 2, the base station apparatus 3 may configure HARQ-ACK transmission timing (value of j) to be used by the terminal apparatus 1, based on the capability information of the terminal apparatus 1. The base station apparatus 3 may configure a prescribed maximum TBS threshold for the value of j. The base station apparatus 3 may transmit (notify) the prescribed maximum TBS threshold corresponding to the value of j through RRC signalling to the terminal apparatus 1. In other words, the corresponding HARQ-ACK transmission timing (value of j) is determined based on the TBS of the scheduled PDSCH.

FIGS. 13A and 13B are diagrams illustrating the maximum TBS threshold and corresponding HARQ-ACK transmission timing (value of j). Different prescribed maximum TBS thresholds may be configured for different values of j. FIG. 13A is an example of a case in which two prescribed maximum TBS thresholds are configured. FIG. 13B is an example of a case in which a single maximum TBS threshold is configured.

In FIG. 13A, the prescribed maximum TBS thresholds are configured as Max TBS1 and Max TBS2. In a case that the TBS calculated based on the DCI format for scheduling of the PDSCH is not greater than the prescribed Max TBS1, the terminal apparatus 1 may determine (switch) the corresponding HARQ-ACK transmission timing (value of j) as j1. In a case that the TBS calculated based on the DCI format for scheduling the PDSCH is in the range from the prescribed Max TBS1 threshold to the prescribed Max TBS2 threshold, the terminal apparatus 1 may determine (switch) the corresponding HARQ-ACK transmission timing (value of j) as j2. In a case that the TBS calculated based on the DCI format for scheduling of the PDSCH is equal to or greater than the prescribed Max TBS2 threshold, the terminal apparatus 1 may determine (switch) the corresponding HARQ-ACK transmission timing (value of j) as 4. Here, the value of j1 may be 2. The value of j2 may be 3.

In a case that the TBS calculated based on the DCI format for scheduling of the PDSCH is not greater than the prescribed Max TBS1 threshold, the terminal apparatus 1 may perform at least part of or all the Reduced timing operation. In a case that the TBS calculated based on the DCI format for scheduling of the PDSCH is within a range from the prescribed Max TBS1 threshold to the prescribed Max TBS2 threshold, the terminal apparatus 1 may perform at least part of or all the Reduced timing operation. In a case that the TBS calculated based on the DCI format for scheduling of the PDSCH is within a range from the prescribed Max TBS1 threshold to the prescribed Max TBS2 threshold, the terminal apparatus 1 may perform at least part of or all the normal timing operation. In a case that the TBS calculated based on the DCI format for scheduling of the PDSCH is equal to or greater than the prescribed Max TBS2 threshold, the terminal apparatus 1 may perform at least part of or all the normal timing operation.

In a case that the transmission timing for HARQ-ACK corresponding to the PDSCH is switched to k1, at least part of or all the Reduced timing operation may be applied. In a case that the transmission timing for HARQ-ACK corresponding to the PDSCH is switched to k2 or 4, at least part of or all the normal timing operation may be applied. In a case that the transmission timing for HARQ-ACK corresponding to the PDSCH is switched to k1 or k2, at least part of or all the Reduced timing operation may be applied. In a case that the transmission timing for HARQ-ACK corresponding to the PDSCH is switched to 4, at least part of or all the normal timing operation may be applied.

In FIG. 13B, the prescribed maximum TBS threshold is configured as Max TBS3. In a case that the TBS calculated based on the DCI format for scheduling of the PDSCH is not greater than prescribed Max TBS3, the terminal apparatus 1 may determine (switch) the corresponding HARQ-ACK transmission timing (value of j) as j3. In a case that the calculated TBS is greater than prescribed Max TBS3, the terminal apparatus 1 may determine (switch) the corresponding HARQ-ACK transmission timing (value of j) as 4. Here, the value of j3 may be 2. The value of j3 may be 3.

In a case that the TBS calculated based on the DCI format for scheduling of the PDSCH is not greater than the prescribed Max TBS3 threshold, the terminal apparatus 1 may perform at least part of or all the Reduced timing operation. In a case that the TBS calculated based on the DCI format for scheduling of the PDSCH is greater than the prescribed Max TBS3 threshold, the terminal apparatus 1 may perform at least part of or all the normal timing operation.

In a case that the transmission timing for HARQ-ACK corresponding to the PDSCH is switched to k3, at least part of or all the Reduced timing operation may be applied. In a case that the transmission timing for HARQ-ACK corresponding to the PDSCH is switched to 4, at least part of or all the normal timing operation may be applied.

The terminal apparatus 1 calculates the TBS of the PDSCH, based on the DCI format for scheduling of the PDSCH. The terminal apparatus 1 determines HARQ-ACK transmission timing (value of j) with reference to the calculated TBS of the PDSCH, FIG. 13A, and FIG. 13B. Next, the terminal apparatus 1 may transmit the corresponding HARQ-ACK in subframe n by using the determined value of j.

The prescribed maximum TBS thresholds (Max TBS1, Max TBS2, Max TBS3) in FIG. 13A and FIG. 13B are configured based on the HARQ-ACK transmission timing (value of j). The prescribed maximum TBS thresholds (Max TBS1, Max TBS2, Max TBS3) in FIGS. 11A and 11B are configured based on the PUSCH transmission timing (value of k). In other words, the prescribed maximum TBS thresholds in FIGS. 13A and 13B may be different from the prescribed maximum TBS thresholds in FIGS. 11A and 11B.

As described above, the prescribed maximum TBS thresholds in FIG. 11A, FIG. 11B, FIG. 13A, and FIG. 13B may be transmitted from the base station apparatus 3 to the terminal apparatus 1 through RRC signalling. The prescribed maximum TBS thresholds in FIG. 11A, FIG. 11B, FIG. 13A, and FIG. 13B may be defined in a specification or the like and known to the base station apparatus 3 and the terminal apparatus 1.

As described above, operation 2 is performed based on determination about the prescribed condition 501. Operation 2 may be performed without being based on determination about the prescribed condition 501. Specifically, the terminal apparatus 1 may, at the time of performing PUSCH transmission, directly perform operation 2, determine PUSCH transmission timing (value of k), and transmit the PUSCH by using the determined value of k, without performing determination about the prescribed condition 501. The terminal apparatus 1 may, at the time of performing HARQ-ACK transmission for the PDSCH, directly perform operation 2, determine corresponding transmission timing (value of j) of the corresponding HARQ-ACK, and transmit the corresponding HARQ-ACK by using the determined value of j, without performing determination about the prescribed condition 501. In other words, operation 2 may be performed independent of (irrespective of) the prescribed condition 501.

Operation 3 will be described in detail below.

In operation 3, the terminal apparatus 1 may determine transmission timing (value of k and/or j), based on the TA value and the prescribed maximum TA threshold. As described above, the TA is used to adjust transmission timing (value of k and/or j) of the terminal apparatus 1 and thus affects the transmission timing (value of k and/or j). The smaller the transmission timing (value of k and/or j) is, the greater the effect of the TA value is. Here, the prescribed maximum TA threshold may be different from the maximum TA threshold described in the fourth condition in FIG. 9.

In particular, in a case that the terminal apparatus 1 performs PUSCH or HARQ-ACK transmission by using k or j that is a value smaller than 4 and a case that the TA value is large, the terminal apparatus 1 fails to secure sufficient processing time from reception of downlink data (PDCCH or PDSCH) to transmission of corresponding uplink data (PUSCH or HARQ-ACK) and to hence transmit the uplink data (PUSCH or HARQ-ACK) in some cases.

In other words, in a case that the terminal apparatus 1 performs PUSCH or HARQ-ACK transmission by using k or j that is a value smaller than 4, the terminal apparatus 1 needs to limit usable maximum TA (or an upper limit of TA or the like) for the value of k or j. In other words, the base station apparatus 3 determines the values of k and j to be used by the terminal apparatus 1, based on the capability information of the terminal apparatus 1. The base station apparatus 3 may configure the prescribed maximum TA threshold for each of the determined values of k and j. The base station apparatus 3 may transmit (notify) the prescribed maximum TA threshold corresponding to each of the values of k and j through RRC signalling to the terminal apparatus 1.

FIGS. 14A and 14B are diagrams illustrating the PUSCH transmission timing (value of k) and the corresponding prescribed maximum TA threshold. Different prescribed maximum TA thresholds may be configured for different values of k. FIG. 14A is an example in which, in a case that the terminal apparatus 1 supports the value of k (ka, kb, or 4), the corresponding prescribed maximum TA threshold is configured. FIG. 14B is an example in which, in a case that the terminal apparatus 1 supports the value of k (kc or 4), the corresponding prescribed maximum TA threshold is configured. For a small value of k, a prescribed small maximum TA threshold may be configured. Based on the relationship between the current TA value and the prescribed maximum TA threshold, the terminal apparatus 1 may determine whether to perform TA reporting.

Here, the value of ka may be 2. The value of kb may be 3. The value of kc may be 2 or 3.

An example of a PUSCH transmission method in operation 3 will be described below. Here, a description will be given by assuming a condition as illustrated in FIG. 14A for the PUSCH transmission method.

For example, in a case that the PUSCH transmission timing (value of k) of the terminal apparatus 1 is 4, the terminal apparatus 1 is to monitor whether the TA value falls below Max TA2. In a case that the TA value of the terminal apparatus 1 is below the prescribed Max TA2, TA reporting is performed. Specifically, the terminal apparatus 1 may report the measured TA value to the base station apparatus 3 through RRC signalling. The base station apparatus 3 transmits, to the terminal apparatus 1, RRC signalling including confirmation information indicating that the TA value is received. The terminal apparatus 1 may switch, after receiving the RRC signalling, the value of k to kb. This means that, in a case of detecting the PDCCH in subframe n, the terminal apparatus 1 transmits the PUSCH scheduled on the PDCCH in subframe n+kb.

For example, in a case that the transmission timing (value of k) of the terminal apparatus 1 is kb, the terminal apparatus 1 monitors two prescribed maximum TA thresholds, Max TA1 and Max TA2. Specifically, in a case that the transmission timing (value of k) of the terminal apparatus 1 is kb, the terminal apparatus 1 monitors whether the TA value falls below Max TA1 and whether the TA value exceeds Max TA2. In a case that the TA value of the terminal apparatus 1 is below the prescribed Max TA1, TA reporting is performed. Specifically, the terminal apparatus 1 may report the measured TA value to the base station apparatus 3 through RRC signalling. The base station apparatus 3 transmits, to the terminal apparatus 1, RRC signalling including confirmation information indicating that the TA value is received. The terminal apparatus 1 may switch, after receiving the RRC signalling, the value of k to ka. This means that, in a case of detecting the PDCCH in subframe n, the terminal apparatus 1 transmits the PUSCH scheduled on the PDCCH in subframe n+ka. In a case that the TA value of the terminal apparatus 1 exceeds the prescribed Max TA2, TA reporting is performed. Specifically, the terminal apparatus 1 may report the measured TA value to the base station apparatus 3 through RRC signalling. The base station apparatus 3 transmits, to the terminal apparatus 1, RRC signalling including confirmation information indicating that the TA value is received. The terminal apparatus 1 may switch, after receiving the RRC signalling, the value of k to 4. This means that, in a case of detecting the PDCCH in subframe n, the terminal apparatus 1 transmits the PUSCH scheduled on the PDCCH in subframe n+4.

For example, in a case that the transmission timing (value of k) of the terminal apparatus 1 is ka, the terminal apparatus 1 monitors the prescribed maximum TA threshold, Max TA1. Specifically, in a case that the transmission timing (value of k) of the terminal apparatus 1 is ka, the terminal apparatus 1 monitors whether the TA value exceeds Max TA1. In a case that the TA value of the terminal apparatus 1 exceeds the prescribed Max TA1, TA reporting is performed. Specifically, the terminal apparatus 1 may report the measured TA value to the base station apparatus 3 through RRC signalling. The base station apparatus 3 transmits, to the terminal apparatus 1, RRC signalling including confirmation information indicating that the TA value is received. The terminal apparatus 1 may switch, after receiving the RRC signalling, the value of k to kb. This means that, in a case of detecting the PDCCH in subframe n, the terminal apparatus 1 transmits the PUSCH scheduled on the PDCCH in subframe n+kb.

In a case that the PUSCH transmission timing is switched to ka, the Reduced timing operation may be applied. In a case that the PUSCH transmission timing is switched to kb or 4, the normal timing operation may be applied. In a case that the PUSCH transmission timing is switched to ka or kb, the Reduced timing operation may be applied. In a case that the PUSCH transmission timing is switched to 4, the normal timing operation may be applied. In a case that the PUSCH transmission timing is switched to kc, the Reduced timing operation may be applied. In a case that the PUSCH transmission timing is switched to 4, the normal timing operation may be applied.

FIGS. 15A and 15B are diagrams illustrating the HARQ-ACK transmission timing (value of j) and the corresponding prescribed maximum TA threshold. Different prescribed maximum TA thresholds may be configured for different values of j. FIG. 15A is an example in which, in a case that the terminal apparatus 1 supports the value of j (ja, jb, or 4), the corresponding prescribed maximum TA threshold is configured. FIG. 15B is an example in which, in a case that the terminal apparatus 1 supports the value of j (jc or 4), the corresponding prescribed maximum TA threshold is configured. For a small value of j, a prescribed small maximum TA threshold may be configured.

Here, the value of ja may be 2. The value of jb may be 3. The value of jc may be 2 or 3.

Here, the maximum TA thresholds (Max TA1, Max TA2, and Max TA3) configured for the value of j may be the same as the maximum TA thresholds configured for the value of k. The maximum TA thresholds (Max TA1, Max TA2, and Max TA3) configured for the value of j may be different from the maximum TA thresholds configured for the value of k.

In a case that the transmission timing for HARQ-ACK corresponding to the PDSCH is switched to ja, at least part of or all the Reduced timing operation may be applied. In a case that the transmission timing for HARQ-ACK corresponding to the PDSCH is switched to jb or 4, at least part of or all the normal timing operation may be applied. In a case that the transmission timing for HARQ-ACK corresponding to the PDSCH is switched to ja or jb, at least part of or all the Reduced timing operation may be applied. In a case that the transmission timing for HARQ-ACK corresponding to the PDSCH is switched to 4, at least part of or all the normal timing operation may be applied. In a case that the transmission timing for HARQ-ACK corresponding to the PDSCH is switched to jc, at least part of or all the Reduced timing operation may be applied. In a case that the transmission timing for HARQ-ACK corresponding to the PDSCH is switched to 4, at least part of or all the normal timing operation may be applied.

An example of an HARQ-ACK transmission method in operation 3 will be described below. Here, a description will be given by assuming a condition as illustrated in FIG. 15B for the HARQ-ACK transmission method.

In the case of FIG. 15B, for example, in a case that the HARQ-ACK transmission timing (value of j) of the terminal apparatus 1 is 4, the terminal apparatus 1 is to monitor whether the TA value falls below Max TA3. In a case that the TA value of the terminal apparatus 1 is below the prescribed Max TA3, TA reporting is performed. Specifically, the terminal apparatus 1 may report the measured TA value to the base station apparatus 3 through RRC signalling. The base station apparatus 3 transmits, to the terminal apparatus 1, RRC signalling including confirmation information indicating that the TA value is received. The terminal apparatus 1 may switch, after receiving the RRC signalling, the value of j to jc. This means that, in a case of detecting the PDSCH in subframe n-jc, the terminal apparatus 1 transmits the HARQ-ACK for the PDSCH in subframe n.

For example, in a case that the HARQ-ACK transmission timing (value of j) of the terminal apparatus 1 is jc, the terminal apparatus 1 is to monitor Max TA3. Specifically, in a case that the HARQ-ACK transmission timing (value of j) of the terminal apparatus 1 is jc, the terminal apparatus 1 is to monitor whether the TA value exceeds Max TA3. In a case that the TA value of the terminal apparatus 1 exceeds the prescribed Max TA3, TA reporting is performed. Specifically, the terminal apparatus 1 may report the measured TA value to the base station apparatus 3 through RRC signalling. The base station apparatus 3 transmits, to the terminal apparatus 1, RRC signalling including confirmation information indicating that the TA value is received. The terminal apparatus 1 may switch, after receiving the RRC signalling, the value of j to 4. This means that, in a case of detecting the PDSCH in subframe n−4, the terminal apparatus 1 transmits the HARQ-ACK for the PDSCH in subframe n.

As described above, the base station apparatus 3 transmits, after receiving the TA reporting from the terminal apparatus 1, RRC signalling including confirmation information indicating that the TA reporting is received, to the terminal apparatus 1. The base station apparatus 3 may transmit the value of k or j through the RRC signalling. The terminal apparatus 1 may switch to the value of k or j included in the RRC signalling with which the transmission timing is received.

Operation 3 is performed based on determination about the prescribed condition 501. Operation 3 may be performed without being based on determination about the prescribed condition 501. Specifically, the terminal apparatus 1 may, at the time of performing PUSCH transmission, directly perform operation 2, determine PUSCH transmission timing (value of k), and transmit the PUSCH by using the determined value of k, without performing determination about the prescribed condition 501. The terminal apparatus 1 may, at the time of performing HARQ-ACK transmission for the PDSCH, directly perform operation 3, determine corresponding transmission timing (value of j) of the corresponding HARQ-ACK, and transmit the corresponding HARQ-ACK by using the determined value of j, without performing determination about the prescribed condition 501. In other words, operation 3 may be performed independent of (irrespective of) the prescribed condition 501.

In the following, in operation 3, the terminal apparatus 1 and the base station apparatus 3 may determine the prescribed maximum TA threshold, based at least on one or some of or all element (A) to element (G) below.

Element A: processing time for HARQ-ACK for PDSCH

Element B: processing time for PUSCH for PDCCH (uplink grant)

Element C: number of symbols constituting supporting sTTI

Element D: maximum TBS threshold for PDSCH

Element E: maximum TBS threshold for PUSCH

Element F: value of transmission timing (value of k and/or j)

Element G: capability information of terminal apparatus 1 indicating above capability (one or some of or all element A to element F)

In element A and element B, for example, a high maximum TA threshold may be configured for the terminal apparatus 1 having short processing time among multiple terminal apparatuses 1 using the same value of transmission timing.

In element C, the number of symbols constituting the sTTI may be assumed to be related to capability to shorten the processing time of the terminal apparatus 1.

In element D and element E, the TBS affects the value of transmission timing. In a case that a high maximum TBS threshold is configured, a low maximum TA threshold needs to be configured.

Element F is a value of transmission timing for uplink data of the terminal apparatus 1. In other words, for the terminal apparatus 1 supporting multiple values of transmission timing, a low maximum TA threshold needs to be configured for a small value of transmission timing.

As described above, operation 2 or operation 3 is performed to determine transmission timing (values of k and j). The base station apparatus 3 may make notification about (indicate) whether to perform operation 2 or operation 3. The terminal apparatus 1 may determine the values of k and j, based on a combination of operation 2 and operation 3.

A method of determining a value of k or j, by using a combination of operation 2 and operation 3 will be described below.

Operation 3 limits the maximum TA threshold for the value of k or j. As described above, the maximum TA threshold for the value of k or j is considered to limit a communicable range (area) of the terminal apparatus 1. In other words, for the terminal apparatus 1, the communicable range is considered to be limited for each of the values of k or j. The TA value may be assumed to indicate a communication distance between the terminal apparatus 1 and the base station apparatus 3. In other words, the TA value limits the usable (supportable) value of k or j. The terminal apparatus 1 having a large TA value is not able to use a small value of k or j to secure processing time for the PUSCH for the uplink grant or processing time for HARQ-ACK for the PDSCH.

First, the terminal apparatus 1 may performs operation 3 to determine transmission timing (value of k or j), based on the TA value and the prescribed maximum TA threshold. A value of k or j that is greater than the determined value of k or j may be used as transmission timing. Sufficient processing time is not able to be secured with a value of k or j that is smaller than the determined value of k or j, and the PUSCH or HARQ-ACK is not able to be transmitted. Hence, such a value is not able to be used as transmission timing. In other words, through operation 3, a set of usable (supportable) values of k or j may be determined by using the TA value. When the TA value changes, a set of usable supportable) values of k or j may also change.

Next, the terminal apparatus 1 performs operation 2 to compare the TBS calculated from the DCI format for scheduling of the PUSCH or the PDSCH with the maximum TBS threshold and determine one value of k or j from among the set of usable values of k or j determined through operation 3. Specifically, as described above, in operation 2, a value of k or j is determined based on the calculated TBS and the maximum TBS threshold. In a case that the value of k or j determined through operation 2 is included in the set of the values of k or j determined through operation 3, the terminal apparatus 1 may use a value of k or j determined through operation 2 as transmission timing. In contrast, in a case that the value of k or j determined through operation 2 is not included in the set of the values of k or j determined through operation 3, the terminal apparatus 1 may use k or j that is the greater value closest to the value of k or j determined through operation 2 from among the set of the values of k or j determined through operation 3, as transmission timing.

A description will be given below of an example in which a value of k is determined based on a combination of operation 2 and operation 3 with reference to the examples in FIG. 11A and FIG. 14A. Here, ka and kb are configured as 2 and 3, respectively. k1 and k2 are configured as 2 and 3, respectively. The terminal apparatus 1 can transmit the PUSCH by using k being any value of 2, 3, and 4 as transmission timing.

For example, in a case that the TA value of the terminal apparatus 1 is not greater than Max TA1 in operation 3, the value of k to be used for PUSCH transmission may be ka(2) with reference to FIG. 14A. After processing time for uplink data is secured, a value of k greater than 2 may also be used as transmission timing. In other words, in a case that the TA value of the terminal apparatus 1 does not exceed Max TA1, a set of values of k that can be used for PUSCH transmission may be {2, 3, 4}.

The terminal apparatus 1 performs operation 2 to compare the TBS calculated from the DCI format for scheduling of the PUSCH with the maximum TBS threshold and determine a value of k. Here, for example, the value of k is determined as k2(3). In other words, k that is a value of 3 determined through operation 2 is included in the set of usable values of k {2, 3, 4}, and thus PUSCH transmission may be performed by using k that is a value of 3.

For example, in a case that the TA value of the terminal apparatus 1 is within a threshold range from Max TA1 to Max TA2, the value of k to be used for PUSCH transmission may be 3. 2, which is a value smaller than 3, is not used as transmission timing. In other words, in a case that the TA value of the terminal apparatus 1 is within a threshold range from Max TA1 to Max TA2, the value of k to be used for PUSCH transmission may be a set {3, 4}.

The terminal apparatus 1 performs operation 2 to compare the TBS calculated from the DCI format for scheduling of the PUSCH with the maximum TBS threshold and determine a value of k. Here, for example, the value of k is determined as k1(2). Specifically, k that is a value of 2 determined through operation 2 is not included in the set of usable values of k {3, 4} determined through operation 3, and thus the terminal apparatus 1 may choose 3, which is the greater value closest to 2, from the set of usable values of k {3, 4} and use 3 as transmission timing.

For example, in a case that the TA value of the terminal apparatus 1 is equal to or greater than Max TA2, the value of k to be used for the transmission may be 4. In other words, k that is a value smaller than 4 is not used as transmission timing. In this case, the terminal apparatus 1 may determine the value of k as 4 irrespective of whether operation 2 is performed.

In a case that a value of k or j is determined through a combination of operation 2 and operation 3, the maximum TBS threshold may be the same as the maximum TBS threshold configured for independent operation 2. The maximum TBS threshold configured for operation 2 and operation 3 may be different from the maximum TBS threshold configured for operation 2 and be newly configured based on the maximum TA threshold for the value of k or j.

Configurations of apparatuses according to the present embodiment will be described below.

Figure 16:
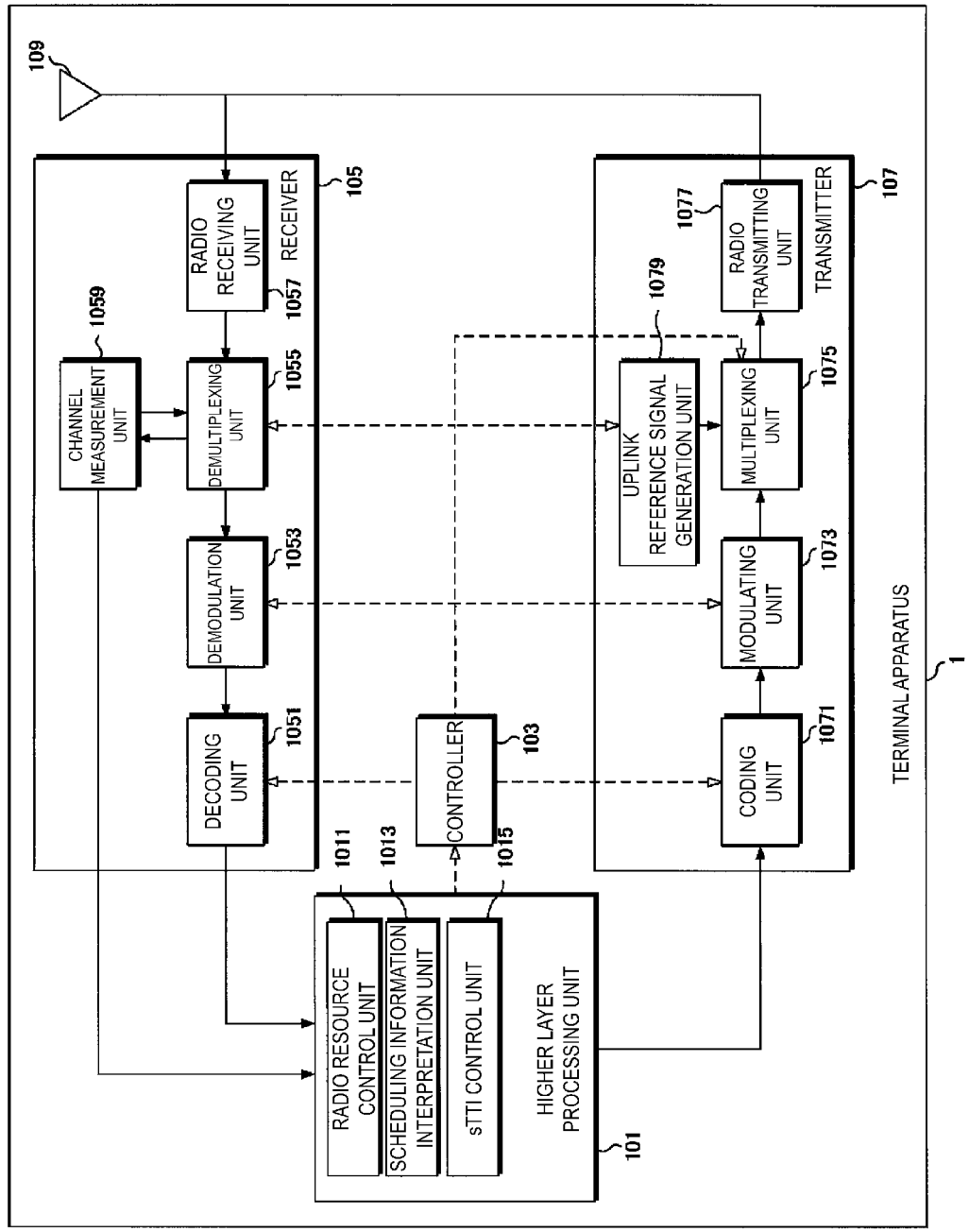
FIG. 16 is a schematic block diagram illustrating a configuration of a terminal apparatus 1 according to the present embodiment.

FIG. 16 is a schematic block diagram illustrating a configuration of the terminal apparatus 1 according to the present embodiment. As illustrated in FIG. 16, the terminal apparatus 1 is configured to include a higher layer processing unit 101, a controller 103, a receiver 105, a transmitter 107, and a transmit and receive antenna 109. The higher layer processing unit 101 is configured to include a radio resource control unit 1011, a scheduling information interpretation unit 1013, and a sTTI control unit 1015. The receiver 105 is configured to include a decoding unit 1051, a demodulation unit 1053, a demultiplexing unit 1055, a radio receiving unit 1057, and a channel measurement unit 1059. The transmitter 107 is configured to include a coding unit 1071, a modulating unit 1073, a multiplexing unit 1075, a radio transmitting unit 1077, and an uplink reference signal generation unit 1079.

The higher layer processing unit 101 outputs the uplink data (the transport block) generated by a user operation or the like, to the transmitter 107. Also, the higher layer processing unit 101 may perform processing of the medium access control (MAC) layer, the packet data convergence protocol (PDCP) layer, the radio link control (RLC) layer, and the radio resource control (RRC) layer.

The radio resource control unit 1011 included in the higher layer processing unit 101 manages various configuration information/parameters of the terminal apparatus 1 itself. The radio resource control unit 1011 sets the various configuration information/parameters in accordance with higher layer signaling received from the base station apparatus 3. To be more specific, the radio resource control unit 1011 sets the various configuration information/parameters in accordance with the information indicating the various configuration information/parameters received from the base station apparatus 3. Furthermore, the radio resource control unit 1011 generates information to be mapped to each uplink channel, and outputs the generated information to the transmitter 107. The radio resource control unit 1011 is also referred to as a configuration unit 1011.

Here, the scheduling information interpretation unit 1013 included in the higher layer processing unit 101 interprets the DCI format (scheduling information, UL grant) received through the receiver 105, generates control information for control of the receiver 105 and the transmitter 107, based on a result of interpreting the DCI format, and outputs the generated control information to the controller 103.

The sTTI control unit 1015 included in the higher layer processing unit 101 performs controls associated with sTTI transmission, based on various configuration information, and information or conditions associated with the SPS such as parameters.

In accordance with the control information originating from the higher layer processing unit 101, the controller 103 generates a control signal for control of the receiver 105 and the transmitter 107. The controller 103 outputs the generated control signal to the receiver 105 and the transmitter 107 to control the receiver 105 and the transmitter 107.

In accordance with the control signal input from the controller 103, the receiver 105 demultiplexes, demodulates, and decodes a reception signal received from the base station apparatus 3 through the transmit and receive antenna 109, and outputs the information resulting from the decoding, to the higher layer processing unit 101.

The radio receiving unit 1057 converts (down-converts) a downlink signal received through the transmit and receive antenna 109 into a baseband signal through orthogonal demodulation, removes unnecessary frequency components, controls an amplification level in such a manner as to suitably maintain a signal level, performs orthogonal demodulation, based on an in-phase component and an orthogonal component of the received signal, and converts the resulting orthogonally-demodulated analog signal into a digital signal. The radio receiving unit 1057 removes a portion corresponding to a Cyclic Prefix (CP) from the digital signal resulting from the conversion, performs Fast Fourier Transform (FFT) on the signal from which the CP has been removed, and extracts a signal in the frequency domain.

The demultiplexing unit 1055 demultiplexes the extracted signal into the PHICH, the PDCCH, the PDSCH, and the downlink reference signal. Moreover, the demultiplexing unit 1055 makes a compensation of channels including the PHICH, the PDCCH, and the PDSCH, from a channel estimate input from the channel measurement unit 1059. Furthermore, the demultiplexing unit 1055 outputs the downlink reference signal resulting from the demultiplexing, to the channel measurement unit 1059.

The demodulation unit 1053 multiplies the PHICH by a corresponding code for composition, demodulates the resulting composite signal in compliance with a Binary Phase Shift Keying (BPSK) modulation scheme, and outputs a result of the demodulation to the decoding unit 1051. The decoding unit 1051 decodes the PHICH destined for the terminal apparatus 1 itself and outputs the HARQ indicator resulting from the decoding to the higher layer processing unit 101. The demodulation unit 1053 demodulates the PDCCH in compliance with a QPSK modulation scheme and outputs a result of the demodulation to the decoding unit 1051. The decoding unit 1051 attempts to decode the PDCCH. In a case of succeeding in the decoding, the decoding unit 1051 outputs downlink control information resulting from the decoding and an RNTI to which the downlink control information corresponds, to the higher layer processing unit 101. The decoding unit 1051 may have a function of performing decoding on a transport block coded through the function of the coding 3001.

The demodulation unit 1053 demodulates the PDSCH in compliance with a modulation scheme notified with the DL grant, such as Quadrature Phase Shift Keying (QPSK), 16 Quadrature Amplitude Modulation (QAM), or 64 QAM, and outputs a result of the demodulation to the decoding unit 1051. The decoding unit 1051 decodes the data in accordance with information of a coding rate notified with the downlink control information, and outputs, to the higher layer processing unit 101, the downlink data (the transport block) resulting from the decoding.

The channel measurement unit 1059 measures a downlink path loss or a channel state from the downlink reference signal input from the demultiplexing unit 1055, and outputs the measured path loss or channel state to the higher layer processing unit 101. Furthermore, the channel measurement unit 1059 calculates a downlink channel estimate from the downlink reference signal and outputs the calculated downlink channel estimate to the demultiplexing unit 1055. The channel measurement unit 1059 performs channel measurement and/or interference measurement in order to calculate the CQI (or the CSI).

The transmitter 107 generates the uplink reference signal in accordance with the control signal input from the controller 103, codes and modulates the uplink data (the transport block) input from the higher layer processing unit 101, multiplexes the PUCCH, the PUSCH, and the generated uplink reference signal, and transmits a result of the multiplexing to the base station apparatus 3 through the transmit and receive antenna 109. Furthermore, the transmitter 107 transmits uplink control information.

The coding unit 1071 performs coding, such as convolutional coding or block coding, on the uplink control information input from the higher layer processing unit 101. Furthermore, the coding unit 1071 performs turbo coding in accordance with information used for the scheduling of the PUSCH. The coding 1071 may have a function similar to the coding 3001.

The modulating unit 1073 modulates coded bits input from the coding unit 1071, in compliance with the modulation scheme notified with the downlink control information, such as BPSK, QPSK, 16 QAM, or 64 QAM, or in compliance with a modulation scheme predetermined in advance for each channel. In accordance with the information used for the scheduling of the PUSCH, the modulating unit 1073 determines the number of data sequences to be spatial-multiplexed, maps multiple pieces of uplink data to be transmitted on the same PUSCH to multiple sequences through Multiple Input Multiple Output Spatial Multiplexing (MIMO SM), and performs precoding on the sequences.

The uplink reference signal generation unit 1079 generates a sequence acquired in accordance with a rule (formula) predetermined in advance, based on a physical layer cell identity (PCI, or referred to as a Cell ID or the like) for identifying the base station apparatus 3, a bandwidth to which the uplink reference signal is mapped, a cyclic shift notified with the UL grant, a parameter value for generation of a DMRS sequence, and the like. In accordance with the control signal input from the controller 103, the multiplexing unit 1075 rearranges modulation symbols of the PUSCH in parallel and then performs Discrete Fourier Transform (DFT) on the rearranged modulation symbols. Furthermore, the multiplexing unit 1075 multiplexes PUCCH and PUSCH signals and the generated uplink reference signal for each transmit antenna port. To be more specific, the multiplexing unit 1075 maps the PUCCH and PUSCH signals and the generated uplink reference signal to the resource elements for each transmit antenna port.

The radio transmitting unit 1077 performs Inverse Fast Fourier Transform (IFFT) on a signal resulting from the multiplexing, generates an SC-FDMA symbol, attaches a CP to the generated SC-FDMA symbol, generates a baseband digital signal, converts the baseband digital signal into an analog signal, removes unnecessary frequency components through a lowpass filter, up-converts a result of the removal into a signal of a carrier frequency, performs power amplification, and outputs a final result to the transmit and receive antenna 109 for transmission.

Figure 17:
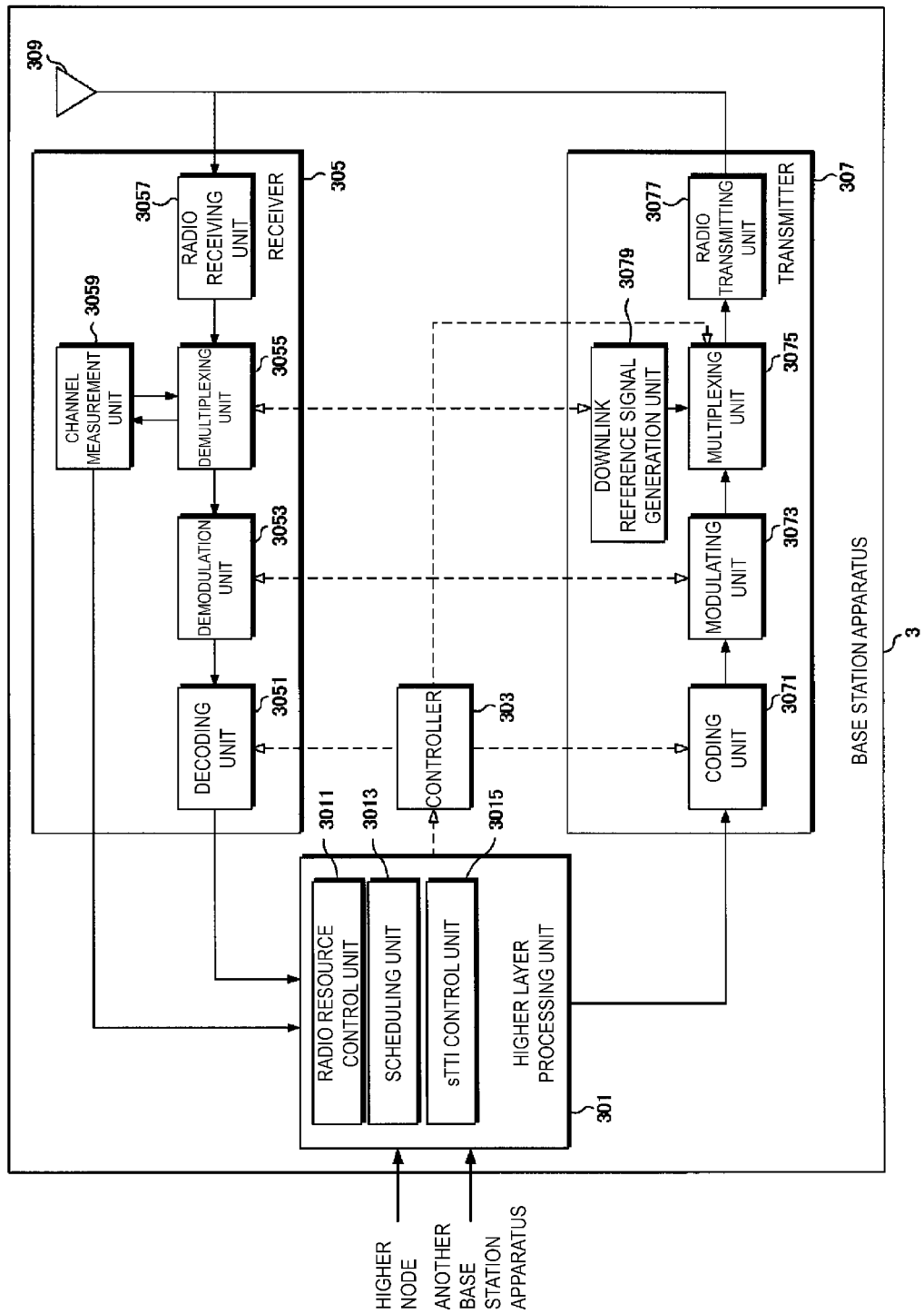
FIG. 17 is a schematic block diagram illustrating a configuration of a base station apparatus 3 according to the present embodiment.

FIG. 17 is a schematic block diagram illustrating a configuration of the base station apparatus 3 according to the present embodiment. As illustrated in the drawing, the base station apparatus 3 is configured to include a higher layer processing unit 301, a controller 303, a receiver 305, a transmitter 307, and a transmit and receive antenna 309. The higher layer processing unit 301 is configured to include a radio resource control unit 3011, a scheduling unit 3013, and a sTTI control unit 3015. The receiver 305 is configured to include a decoding unit 3051, a demodulation unit 3053, a demultiplexing unit 3055, a radio receiving unit 3057, and a channel measurement unit 3059. The transmitter 307 is configured to include a coding unit 3071, a modulating unit 3073, a multiplexing unit 3075, a radio transmitting unit 3077, and a downlink reference signal generation unit 3079.

The higher layer processing unit 301 performs processing of the Medium Access Control (MAC) layer, the Packet Data Convergence Protocol (PDCP) layer, the Radio Link Control (RLC) layer, and the Radio Resource Control (RRC) layer. Furthermore, the higher layer processing unit 301 generates control information for control of the receiver 305 and the transmitter 307, and outputs the generated control information to the controller 303.

The radio resource control unit 3011 included in the higher layer processing unit 301 generates, or acquires from a higher node, the downlink data (the transport block) mapped to the downlink PDSCH, system information, the RRC message, the MAC Control Element (CE), and the like, and outputs a result of the generation or the acquirement to the transmitter 307. Furthermore, the radio resource control unit 3011 manages various configuration information/parameters for each of the terminal apparatuses 1. The radio resource control unit 3011 may configure various configuration information/parameters for each of the terminal apparatuses 1 through higher layer signaling. In other words, the radio resource control unit 1011 transmits/broadcasts information indicating various configuration information/parameters. The radio resource control unit 3011 is also referred to as a configuration unit 3011.

The scheduling unit 3013 included in the higher layer processing unit 301 determines a frequency and a subframe to which the physical channels (PDSCH and PUSCH) are allocated, the coding rate and modulation scheme for the physical channels (PDSCH and PUSCH), the transmit power, and the like, from the received channel state information and from the channel estimate, channel quality, or the like input from the channel measurement unit 3059. The scheduling unit 3013 generates the control information (e.g., the DCI format) in order to control the receiver 305 and the transmitter 307 in accordance with a result of the scheduling, and outputs the generated information to the controller 303.

The scheduling unit 3013 further determines timing of performing transmission processing and reception processing.

The sTTI control unit 3015 included in the higher layer processing unit 301 performs controls concerning the SPS, based on various configuration information, and information or conditions regarding the SPS such as parameters.

In accordance with the control information originating from the higher layer processing unit 301, the controller 303 generates a control signal for control of the receiver 305 and the transmitter 307. The controller 303 outputs the generated control signal to the receiver 305 and the transmitter 307 to control the receiver 305 and the transmitter 307.

In accordance with the control signal input from the controller 303, the receiver 305 demultiplexes, demodulates, and decodes the reception signal received from the terminal apparatus 1 through the transmit and receive antenna 309, and outputs information resulting from the decoding to the higher layer processing unit 301. The radio receiving unit 3057 converts (down-converts) an uplink signal received through the transmit and receive antenna 309 into a baseband signal through orthogonal demodulation, removes unnecessary frequency components, controls the amplification level in such a manner as to suitably maintain a signal level, performs orthogonal demodulation, based on an in-phase component and an orthogonal component of the received signal, and converts the resulting orthogonally-demodulated analog signal into a digital signal. The receiver 305 receives the uplink control information.

The radio receiving unit 3057 removes a portion corresponding to a Cyclic Prefix (CP) from the digital signal resulting from the conversion. The radio receiving unit 3057 performs Fast Fourier Transform (FFT) on the signal from which the CP has been removed, extracts a signal in the frequency domain, and outputs the resulting signal to the demultiplexing unit 3055.

The demultiplexing unit 1055 demultiplexes the signal input from the radio receiving unit 3057 into the PUCCH, the PUSCH, and the signal such as the uplink reference signal. Note that the demultiplexing is performed based on radio resource allocation information that is determined in advance by the base station apparatus 3 using the radio resource control unit 3011 and that is included in the UL grant notified to each of the terminal apparatuses 1. Furthermore, the demultiplexing unit 3055 makes a compensation of channels including the PUCCH and the PUSCH from the channel estimate input from the channel measurement unit 3059. Furthermore, the demultiplexing unit 3055 outputs an uplink reference signal resulting from the demultiplexing, to the channel measurement unit 3059.

The demodulation unit 3053 performs Inverse Discrete Fourier Transform (IDFT) on the PUSCH, acquires modulation symbols, and performs reception signal demodulation, that is, demodulates each of the modulation symbols on the PUCCH and the PUSCH, in compliance with the modulation scheme predetermined in advance, such as Binary Phase Shift Keying (BPSK), QPSK, 16 QAM, or 64 QAM, or in compliance with the modulation scheme that the base station apparatus 3 itself notified in advance with the UL grant each of the terminal apparatuses 1. The demodulation unit 3053 demultiplexes the modulation symbols of multiple pieces of uplink data transmitted on the same PUSCH with the MIMO SM, based on the number of spatial-multiplexed sequences notified in advance with the UL grant to each of the terminal apparatuses 1 and information indicating the precoding to be performed on the sequences.

The decoding unit 3051 decodes the coded bits of PUCCH and PUSCH, which have been demodulated, at the coding rate in compliance with a coding scheme prescribed in advance, the coding rate being prescribed in advance or being notified in advance with the UL grant to the terminal apparatus 1 by the base station apparatus 3 itself, and outputs the decoded uplink data and uplink control information to the higher layer processing unit 101. In a case where the PUSCH is re-transmitted, the decoding unit 3051 performs the decoding with the coded bits input from the higher layer processing unit 301 and retained in an HARQ buffer, and the demodulated coded bits. The channel measurement unit 309 measures the channel estimate, the channel quality, and the like, based on the uplink reference signal input from the demultiplexing unit 3055, and outputs a result of the measurement to the demultiplexing unit 3055 and the higher layer processing unit 301. The decoding unit 3051 may have a function of performing decoding on a transport block coded through the function of the coding 3001.

The transmitter 307 generates the downlink reference signal in accordance with the control signal input from the controller 303, codes and modulates the HARQ indicator, the downlink control information, and the downlink data that are input from the higher layer processing unit 301, multiplexes the PHICH, the PDCCH, the PDSCH, and the downlink reference signal, and transmits a result of the multiplexing to the terminal apparatus 1 through the transmit and receive antenna 309.

The coding unit 3071 codes the HARQ indicator, the downlink control information, and the downlink data that are input from the higher layer processing unit 301, in compliance with the coding scheme predetermined in advance, such as block coding, convolutional coding, or turbo coding, or in compliance with the coding scheme determined by the radio resource control unit 3011. The modulating unit 3073 modulates the coded bits input from the coding unit 3071, in compliance with the modulation scheme predetermined in advance, such as BPSK, QPSK, 16 QAM, or 64 QAM, or in compliance with the modulation scheme determined by the radio resource control unit 3011. The coding unit 3071 may have a function similar to the coding 3001.

The downlink reference signal generation unit 3079 generates, as the downlink reference signal, a sequence that is already known to the terminal apparatus 1 and that is acquired in accordance with a rule predetermined in advance, based on the Physical layer Cell Identifier (PCI) for identifying the base station apparatus 3, and the like. The multiplexing unit 3075 multiplexes the modulated modulation symbol of each channel and the generated downlink reference signal. To be more specific, the multiplexing unit 3075 maps the modulated modulation symbol of each channel and the generated downlink reference signal to the resource elements.

The radio transmitting unit 3077 performs Inverse Fast Fourier Transform (IFFT) on the modulation symbol resulting from the multiplexing or the like, generates an OFDM symbol, attaches a CP to the generated OFDM symbol, generates a baseband digital signal, converts the baseband digital signal into an analog signal, removes unnecessary frequency components through a lowpass filter, up-converts a result of the removal into a signal of a carrier frequency, performs power amplification, and outputs a final result to the transmit and receive antenna 309 for transmission.

Various units constituting the terminal apparatus 1 and the base station apparatus 3 may be circuits. For example, the transmitter 107 may be a transmission circuit 107.

Hereinafter, various aspects of the terminal apparatus 1 and the base station apparatus 3 according to the present embodiment will be described.

(1) To accomplish the object described above, aspects of the present invention are contrived to provide the following measures. Specifically, a first aspect of the present invention is the terminal apparatus 1 including: the receiver 105 configured to detect a PDCCH including a DCI format; the coding unit 1071 configured to generate coded bits, based on the PDCCH; and the transmitter 107 configured to transmit a PUSCH including the coded bits. Mapping of the coded bits is given based at least on a first condition or a second condition. The first condition is that a search space in which the PDCCH is detected is either CSS or USS. The second condition is whether CRC parity bits attached to the DCI format are scrambled with any RNTI.

(2) In the first aspect of the present embodiment, in a case that the receiver 105 detects the PDCCH in subframe n, the transmitter 107 performs transmission of the PUSCH in subframe n+k. In a case that the PDCCH is detected in the USS and the CRC parity bits attached to the DCI format are scrambled with C-RNTI, the mapping is given based on TBS calculated based on the DCI format and a TBS threshold.

(3) In the first aspect of the present invention, the receiver 105 receives information indicating the TBS threshold.

(4) In the first aspect of the present invention, in a case that the PDCCH is detected in the CSS and the CRC parity bits attached to the DCI format are scrambled with C-RNTI, the mapping is given irrespective of the TBS calculated based on the DCI format and the TBS threshold.

(5) A fifth aspect of the present invention is the base station apparatus 3 including: the transmitter 307 configured to transmit a PDCCH including a DCI format; the receiver 305 configured to receive a PUSCH transmitted based on the DCI format; and the decoding unit 3051 configured to decode coded bits included in the PUSCH. Mapping of the coded bits is given based at least on a first condition or a second condition. The first condition is that a search space in which the PDCCH is transmitted is either CSS or USS. The second condition is whether CRC parity bits attached to the DCI format are scrambled with any RNTI.

(6) In the second aspect of the present invention, in a case that the transmitter 307 transmits the PDCCH in subframe n, the receiver 305 performs reception of the PUSCH in subframe n+k. In a case that the PDCCH is transmitted in the USS and the CRC parity bits attached to the DCI format are scrambled with C-RNTI, the mapping is given irrespective of TBS calculated based on the DCI format and a TBS threshold.

(7) In the second aspect of the present invention, the transmitter 307 transmits information indicating the TBS threshold.

(8) In the second aspect of the present invention, in a case that the PDCCH is transmitted in the CSS and the CRC parity bits attached to the DCI format are scrambled by C-RNTI, the mapping is given irrespective of the TBS calculated based on the DCI format and the TBS threshold.

(A1) An aspect of the present invention is a terminal apparatus including: a receiver configured to detect a DCI format in a search space; a coding unit configured to divide a transport block into one or multiple code blocks, based at least on the DCI format and code the one or multiple code blocks to generate coded bits; and a transmitter configured to transmit the coded bits on a PUSCH, wherein multiplexed bits are given based at least on concatenation of the coded bits generated by coding the one or multiple code blocks, the coding unit maps the multiplexed bits to a matrix in a first-axis prioritized manner and reads out the multiplexed bits mapped to the matrix in the first-axis prioritized manner or a second-axis prioritized manner, and whether to prioritize the first axis or the second axis in a case of reading out the multiplexed bits mapped to the matrix, is based at least on whether or not the search space is CSS.

(A2) In an aspect of the present invention, in the above-described terminal apparatus, in a case that the search space is the CSS, a subframe in which the PUSCH is transmitted is a third subframe from a subframe in which the DCI format is detected, and in a case that the search space is the CSS, the subframe in which the PUSCH is transmitted is a fourth subframe from the subframe in which the DCI format is detected.

(A3) An aspect of the present invention is a base station apparatus including: a transmitter configured to transmit a DCI format in a search space; a receiver configured to receive a PUSCH transmitted based on the DCI format; and a decoding unit configured to decode coded bits of one or multiple code blocks given by dividing a transport block included in the PUSCH, wherein multiplexed bits are given based at least on concatenation of the coded bits generated by coding the one or multiple code blocks, the decoding unit maps the multiplexed bits to a matrix in a first-axis prioritized manner and reads out the multiplexed bits mapped to the matrix in the first-axis prioritized manner or a second-axis prioritized manner, and whether to prioritize the first axis or the second axis in a case of reading out the multiplexed bits mapped to the matrix, is based at least on whether or not the search space is CSS.

(A4) In an aspect of the present invention, in the above-described base station apparatus, in a case that the search space is the CSS, a subframe in which the PUSCH is transmitted is a third subframe from a subframe in which the DCI format is detected, and in a case that the search space is the CSS, the subframe in which the PUSCH is transmitted is a fourth subframe from the subframe in which the DCI format is detected.

(A5) An aspect of the present invention is a communication method used by a terminal apparatus, the communication method including the steps of: detecting a DCI format in a search space; dividing a transport block into one or multiple code blocks, based at least on the DCI format; coding the one or multiple code blocks to generate coded bits; and transmitting the coded bits on a PUSCH, wherein multiplexed bits are given based at least on concatenation of the coded bits generated by coding the one or multiple code blocks, the multiplexed bits are mapped to a matrix in a first-axis prioritized manner, and the multiplexed bits mapped to the matrix are read out in the first-axis prioritized manner or a second-axis prioritized manner, and whether to prioritize the first axis or the second axis in a case of reading out the multiplexed bits mapped to the matrix, is based at least on whether or not the search space is CSS.

(A6) An aspect of the present invention is a communication method used by a base station apparatus, the communication method including the steps of: transmitting a DCI format in a search space; receiving a PUSCH transmitted based on the DCI format; and decoding coded bits of one or multiple code blocks given by dividing a transport block included in the PUSCH, wherein multiplexed bits are given based at least on concatenation of the coded bits generated by coding the one or multiple code blocks, the multiplexed bits are mapped to a matrix in a first-axis prioritized manner, and the multiplexed bits mapped to the matrix are read out in the first-axis prioritized manner or a second-axis prioritized manner, and whether to prioritize the first axis or the second axis in a case of reading out the multiplexed bits mapped to the matrix, is based at least on whether or not the search space is CSS.

(A7) An aspect of the present invention is an integrated circuit mounted on a terminal apparatus, the integrated circuit including: a receiver circuit configured to detect a DCI format in a search space; a coding circuit configured to divide a transport block into one or multiple code blocks, based at least on the DCI format and code the one or multiple code blocks to generate coded bits; and a transmitter circuit configured to transmit the coded bits on a PUSCH, wherein multiplexed bits are given based at least on concatenation of the coded bits generated by coding the one or multiple code blocks, the multiplexed bits are mapped to a matrix in a first-axis prioritized manner, and the multiplexed bits mapped to the matrix are read out in the first-axis prioritized manner or a second-axis prioritized manner, and whether to prioritize the first axis or the second axis in a case of reading out the multiplexed bits mapped to the matrix, is based at least on whether or not the search space is CSS.

(A8) An aspect of the present invention is an integrated circuit mounted on a base station apparatus, the integrated circuit including: a transmitter circuit configured to transmit a DCI format in a search space; a receiver circuit configured to receive a PUSCH transmitted based on the DCI format; and a decoding circuit configured to decode coded bits of one or multiple code blocks given by dividing a transport block included in the PUSCH, wherein multiplexed bits are given based at least on concatenation of the coded bits generated by coding the one or multiple code blocks, the multiplexed bits are mapped to a matrix in a first-axis prioritized manner, and the multiplexed bits mapped to the matrix are read out in the first-axis prioritized manner or a second-axis prioritized manner, and whether to prioritize the first axis or the second axis in a case of reading out the multiplexed bits mapped to the matrix, is based at least on whether or not the search space is CSS.

With this, the terminal apparatus 1 can transmit and/or receive data efficiently. In addition, the base station apparatus 3 can transmit and/or receive data efficiently.

A program running on each of the base station apparatus 3 and the terminal apparatus 1 according to the aspects of the present invention may be a program that controls a Central Processing Unit (CPU) and the like (program that controls a computer) so as to realize the functions of the above-described embodiments according to the aspects of the present invention. The information handled in these devices is temporarily stored in a Random Access Memory (RAM) while being processed. Thereafter, the information is stored in various types of Read Only Memory (ROM) such as a Flash ROM and a Hard Disk Drive (HDD), and when necessary, is read by the CPU to be modified or rewritten.

Note that the terminal apparatus 1 and the base station apparatus 3 according to the above-described embodiment may be partially achieved by a computer. In that case, this configuration may be realized by recording a program for realizing such control functions on a computer-readable recording medium and causing a computer system to read the program recorded on the recording medium for execution.

Note that it is assumed that the "computer system" mentioned here refers to a computer system built into the terminal apparatus 1 or the base station apparatus 3, and the computer system includes an OS and hardware components such as a peripheral apparatus. Furthermore, the "computer-readable recording medium" refers to a portable medium such as a flexible disk, a magneto-optical disk, a ROM, a CD-ROM, and the like, and a storage apparatus such as a hard disk built into the computer system.

Moreover, the "computer-readable recording medium" may include a medium that dynamically retains a program for a short period of time, such as a communication line that is used to transmit the program over a network such as the Internet or over a communication line such as a telephone line, and may also include a medium that retains a program for a fixed period of time, such as a volatile memory within the computer system for functioning as a server or a client in such a case. Furthermore, the program may be configured to realize some of the functions described above, and also may be configured to be capable of realizing the functions described above in combination with a program already recorded in the computer system.

The base station apparatus 3 according to the above-described embodiment may be achieved as an aggregation (apparatus group) constituted of multiple apparatuses. Each of the apparatuses configuring such an apparatus group may include some or all portions of each function or each functional block of the base station apparatus 3 according to the above-described embodiment. The apparatus group may include each general function or each functional block of the base station apparatus 3. Furthermore, the terminal apparatus 1 according to the above-described embodiment can also communicate with the base station apparatus as the aggregation.

Furthermore, the base station apparatus 3 according to the above-described embodiment may serve as an Evolved Universal Terrestrial Radio Access Network (EUTRAN). Furthermore, the base station apparatus 3 according to the above-described embodiment may have some or all portions of the functions of a node higher than an eNodeB.

Furthermore, some or all portions of each of the terminal apparatus 1 and the base station apparatus 3 according to the above-described embodiment may be typically achieved as an LSI which is an integrated circuit or may be achieved as a chip set. The functional blocks of each of the terminal apparatus 1 and the base station apparatus 3 may be individually achieved as a chip, or some or all of the functional blocks may be integrated into a chip. Furthermore, a circuit integration technique is not limited to the LSI, and may be realized with a dedicated circuit or a general-purpose processor. Furthermore, in a case where with advances in semiconductor technology, a circuit integration technology with which an LSI is replaced appears, it is also possible to use an integrated circuit based on the technology.

Furthermore, according to the above-described embodiment, the terminal apparatus has been described as an example of a communication apparatus, but the present invention is not limited to such a terminal apparatus, and is applicable to a terminal apparatus or a communication apparatus of a fixed-type or a stationary-type electronic apparatus installed indoors or outdoors, for example, such as an Audio-Video (AV) apparatus, a kitchen apparatus, a cleaning or washing machine, an air-conditioning apparatus, office equipment, a vending machine, and other household apparatuses.

The embodiment of the present invention has been described in detail above referring to the drawings, but the specific configuration is not limited to the embodiment and includes, for example, an amendment to a design that falls within the scope that does not depart from the gist of the present invention. Furthermore, various modifications can be made to an aspect of the present invention within the scope of the present invention defined by claims, and embodiments that are made by suitably combining technical means disclosed according to the different embodiments are also included in the technical scope of the present invention. Furthermore, a configuration in which constituent elements, described in the respective embodiments and having mutually the same effects, are substituted for one another is also included in the technical scope of the present invention.

INDUSTRIAL APPLICABILITY

An aspect of the present invention can be used, for example, for a communication system, communication equipment (e.g., a mobile phone apparatus, a base station apparatus, a radio LAN apparatus, or a sensor device), an integrated circuit (e.g., a communication chip), a program, or the like.

REFERENCE SIGNS LIST 1 (1A, 1B, 1C) Terminal apparatus
3 Base station apparatus
101 Higher layer processing unit
103 Controller
105 Receiver
107 Transmitter
301 Higher layer processing unit
303 Controller
305 Receiver
307 Transmitter
1011 Radio resource control unit
1013 Scheduling information interpretation unit
1015 sTTI control unit
3000 Transmission process
3001 Coding
3002 Scrambling
3003 Modulation mapper
3004 Layer mapper
3005 Transform precoder
3006 Precoder
3007 Resource element mapper
3008 OFDM baseband signal generation
3011 Radio resource control unit
3013 Scheduling unit
3015 sTTI control unit
4001 CRC attachment unit
4002 Encoder unit
4003 Sub-block interleaver unit
4004 Bit collection unit
4005 Bit selection and pruning unit
4006 Concatenation unit
4007 Control and data multiplexing unit
4008 Channel interleaver unit
4010 Segmentation and CRC unit
4011 Code block segmentation unit
4012 CRC attachment unit

The invention claimed is:

1. A terminal device comprising:
encoding circuitry configured to and/or programmed to
divide a first sequence that is a transport block with Cyclic Redundancy Check (CRC) into a plurality of code blocks, and
generate coded bits including first coded bits or second coded bits by applying an error correcting code to the plurality of the code blocks, and
transmission circuitry configured to and/or programmed to transmit a second sequence on a Physical Uplink Shared Channel (PUSCH) scheduled by a Physical Downlink Control Channel (PDCCH), wherein
in a case that the PDCCH is detected in a first search space, the second sequence is given by mapping the first coded bits to a first matrix in a first-axis prioritized manner, and reading out the first coded bits in a second-axis prioritized manner, the first matrix being defined by a first axis and a second-axis and
in a case that the PDCCH is detected in a second search space, the second sequence is given by mapping the second coded bits to a second matrix in a third-axis prioritized manner, and reading out the second coded bits in a third-axis prioritized manner, the second matrix being defined by a third-axis and a fourth-axis.

2. A base station device comprising:
reception circuitry configured to and/or programmed to receive a second sequence on a Physical Uplink Shared Channel (PUSCH) scheduled by a Physical Downlink Control Channel (PDCCH), wherein
a first sequence that is a transport block with Cyclic Redundancy Check (CRC) is divided into a plurality of code blocks,
coded bits including first coded bits or second coded bits are generated by applying an error correcting code to the plurality of the code blocks,
in a case that the PDCCH is detected in a first search space, the second sequence is given by mapping the first coded bits to a first matrix in a first-axis prioritized manner, and reading out the first coded bits in a second-axis prioritized manner, the first matrix being defined by first-axis and a second-axis, and
in a case that the PDCCH is detected in a second search space, the second sequence is given by mapping the second coded bits to a second matrix in a third-axis prioritized manner, and reading out the second coded bits in a third-axis prioritized manner, the second matrix being defined by a third-axis and a fourth-axis.

3. A method of a terminal device, comprising:
dividing a first sequence that is a transport block with Cyclic Redundancy Check (CRC) into a plurality of code blocks,
generating coded bits including first coded bits or second coded bits by applying an error correcting code to the plurality of the code blocks, and
transmitting a second sequence on a Physical Uplink Shared Channel (PUSCH) scheduled by a Physical Downlink Control Channel (PDCCH), wherein
in a case that the PDCCH is detected in a first search space, the second sequence is given by mapping the first coded bits to a first matrix in a first-axis prioritized manner, and reading out the first coded bits in a second-axis prioritized manner, the first matrix being defined by a first-axis and a second-axis, and
in a case that the PDCCH is detected in a second search space, the second sequence is given by mapping the second coded bits to a second matrix in a third-axis prioritized manner, and reading out the second coded bits in a third-axis prioritized manner, the second matrix being defined by a third-axis and a fourth-axis.

4. A method of a base station device, comprising:
receiving a second sequence on a Physical Uplink Shared Channel (PUSCH) scheduled by a Physical Downlink Control Channel (PDCCH), wherein
a first sequence that is a transport block with Cyclic Redundancy Check (CRC) is divided into a plurality of code blocks,
coded bits including first coded bits or second coded bits are generated by applying an error correcting code to the plurality of the code blocks, in a case that the PDCCH is detected in a first search space, the second sequence is given by mapping the first coded bits to a first matrix in a first-axis prioritized manner, and reading out the first coded bits in a second-axis prioritized manner, the first matrix being defined by a first-axis and a second-axis and in a case that the PDCCH is detected in a second search space, the second sequence is given by mapping the second coded bits to a second matrix in a third-axis prioritized manner, and reading out the second coded bits in a third-axis prioritized manner, the second matrix being defined by a third-axis and a fourth-axis.

* * * * *